United States Patent
Freed et al.

(10) Patent No.: US 11,437,274 B2
(45) Date of Patent: Sep. 6, 2022

(54) FULLY SELF-ALIGNED VIA

(71) Applicant: Micromaterials LLC, Wilmington, DE (US)

(72) Inventors: Regina Freed, Los Altos, CA (US); Madhur Sachan, Belmont, CA (US); Susmit Singha Roy, Sunnyvale, CA (US); Gabriela Alva, Campbell, CA (US); Ho-yung David Hwang, Cupertino, CA (US); Uday Mitra, Cupertino, CA (US); El Mehdi Bazizi, San Jose, CA (US); Angada Bangalore Sachid, San Jose, CA (US); He Ren, San Jose, CA (US); Sushant Mittal, Karnataka (IN)

(73) Assignee: Micromaterials LLC, Wilmington, DE (US)

( * ) Notice: Subject to any disclaimer, the term of this patent is extended or adjusted under 35 U.S.C. 154(b) by 0 days.

(21) Appl. No.: 17/019,909

(22) Filed: Sep. 14, 2020

(65) Prior Publication Data

US 2021/0090952 A1     Mar. 25, 2021

Related U.S. Application Data

(60) Provisional application No. 62/909,420, filed on Oct. 2, 2019, provisional application No. 62/905,537, filed on Sep. 25, 2019.

(51) Int. Cl.
  H01L 21/768     (2006.01)
  H01L 23/522     (2006.01)
  (Continued)

(52) U.S. Cl.
  CPC .. H01L 21/76897 (2013.01); H01L 21/76804 (2013.01); H01L 21/76808 (2013.01);
  (Continued)

(58) Field of Classification Search
  CPC ......... H01L 21/76804; H01L 21/76808; H01L 21/76831; H01L 21/76843; H01L 21/76871; H01L 23/5226; H01L 23/53295
  See application file for complete search history.

(56) References Cited

U.S. PATENT DOCUMENTS 6,653,200 B2  11/2003  Olsen
8,575,753 B2  11/2013  Choi et al.
(Continued)

FOREIGN PATENT DOCUMENTS

JP    2008108757 A    5/2008
JP    2011233922 A    11/2011
WO    2017136577 A1    8/2017

OTHER PUBLICATIONS

PCT International Search Report and Written Opinion in PCT/US2017/053936 dated Jan. 12, 2018, 10 pages.
(Continued)

*Primary Examiner* — Dale E Page
*Assistant Examiner* — Quovaunda Jefferson
(74) *Attorney, Agent, or Firm* — Servilla Whitney LLC

(57) ABSTRACT

Apparatuses and methods to provide a fully self-aligned via are described. A first metallization layer comprises a set of first conductive lines extending along a first direction on a first insulating layer on a substrate, the set of first conductive lines recessed below a top portion of the first insulating layer. A capping layer is on the first insulating layer, and a second insulating layer is on the capping layer. A second metallization layer comprises a set of second conductive lines on the second insulating layer and on a third insulating layer above the first metallization layer. The set of second conductive lines extend along a second direction that crosses the first direction at an angle. At least one via is between the first metallization layer and the second metallization layer. The via is self-aligned along the second direction to one of
(Continued)

the first conductive lines. The tapering angle of the via opening may be in a range of from about 60° to about 120°.

9 Claims, 26 Drawing Sheets

(51) Int. Cl.
*H01L 23/532* (2006.01)
*H01L 21/311* (2006.01)

(52) U.S. Cl.
CPC .. *H01L 21/76831* (2013.01); *H01L 21/76843* (2013.01); *H01L 21/76871* (2013.01); *H01L 23/5226* (2013.01); *H01L 23/53295* (2013.01); *H01L 21/31111* (2013.01); *H01L 2221/1026* (2013.01); *H01L 2221/1036* (2013.01)

(56) References Cited

U.S. PATENT DOCUMENTS

| | | | |
|---|---|---|---|
| 8,951,429 | B1 | 2/2015 | Liu et al. |
| 9,236,292 | B2 | 1/2016 | Romero et al. |
| 9,324,650 | B2 | 4/2016 | Edelstein et al. |
| 9,362,165 | B1 | 6/2016 | Bouche et al. |
| 9,362,413 | B2 | 6/2016 | Yu et al. |
| 9,397,045 | B2 * | 7/2016 | Peng ............... H01L 21/76877 |
| 9,666,451 | B2 | 5/2017 | Wallace et al. |
| 10,553,485 | B2 * | 2/2020 | Zhang ............. H01L 21/76879 |
| 2005/0167846 | A1 | 8/2005 | Aoyama |
| 2008/0160783 | A1 | 7/2008 | Watanabe et al. |
| 2009/0269569 | A1 | 10/2009 | Fucsko et al. |
| 2010/0301480 | A1 | 12/2010 | Choi et al. |
| 2011/0281417 | A1 | 11/2011 | Gordon et al. |
| 2013/0072019 | A1 | 3/2013 | Ryan |
| 2014/0029181 | A1 | 1/2014 | Gstrein |
| 2015/0132901 | A1 | 5/2015 | Wang et al. |
| 2015/0279736 | A1 | 10/2015 | Hotta et al. |
| 2015/0364420 | A1 | 12/2015 | Mei et al. |
| 2015/0371896 | A1 | 12/2015 | Chen et al. |
| 2016/0141416 | A1 | 5/2016 | Mariani et al. |
| 2016/0163587 | A1 | 6/2016 | Backes et al. |
| 2016/0163640 | A1 | 6/2016 | Edelstein et al. |
| 2016/0190009 | A1 | 6/2016 | Wallace et al. |
| 2018/0096847 | A1 | 4/2018 | Thompson et al. |
| 2018/0374750 | A1 * | 12/2018 | Zhang ............. H01L 21/76885 |

OTHER PUBLICATIONS

PCT International Search Report and Written Opinion in PCT/US2017/060367 dated Feb. 22, 2018, 9 pages.

PCT International Search Report and Written Opinion in PCT/US2018/026026, dated Jul. 26, 2018, 11 pages.

* cited by examiner

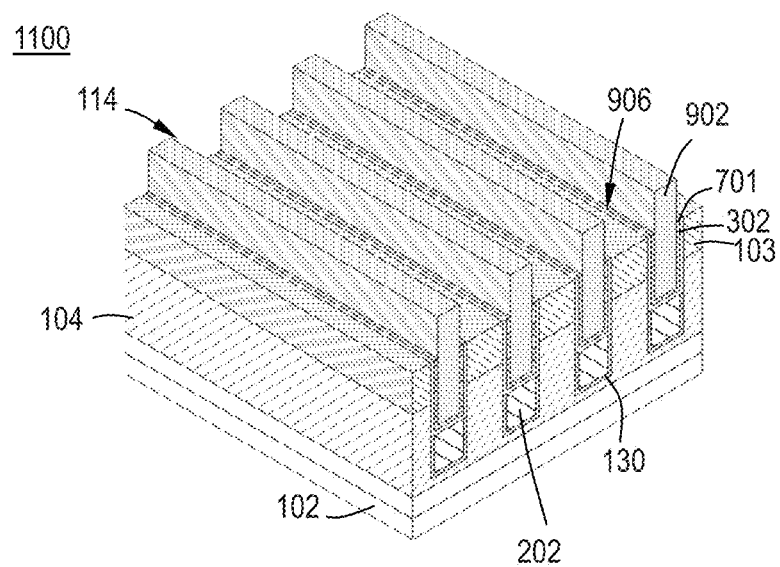
FIG. 11A
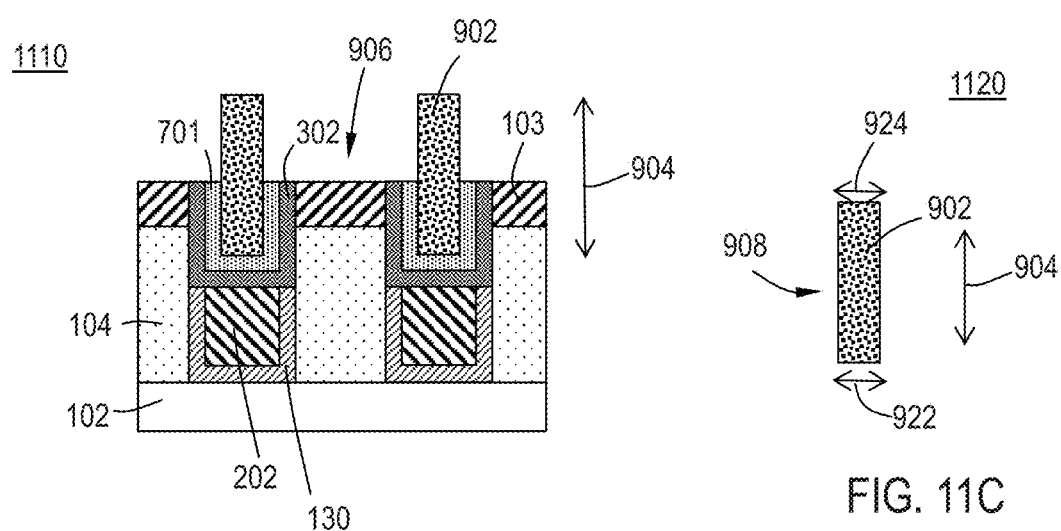
FIG. 11B
FIG. 11C

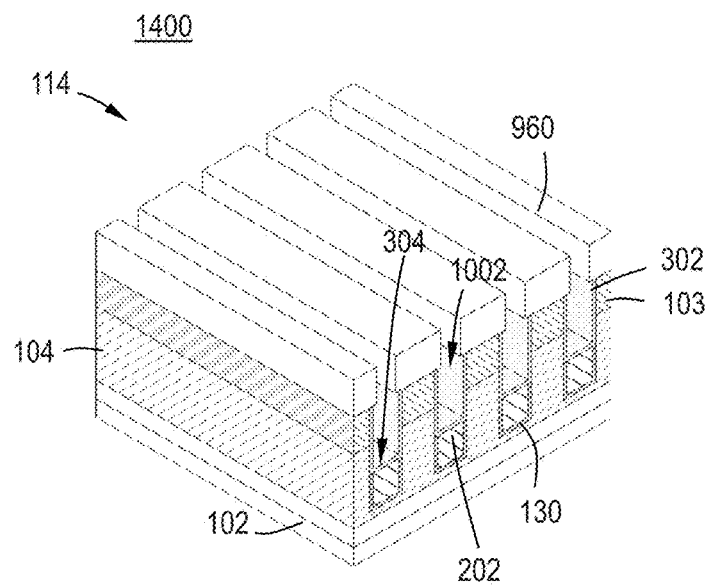
FIG. 14A
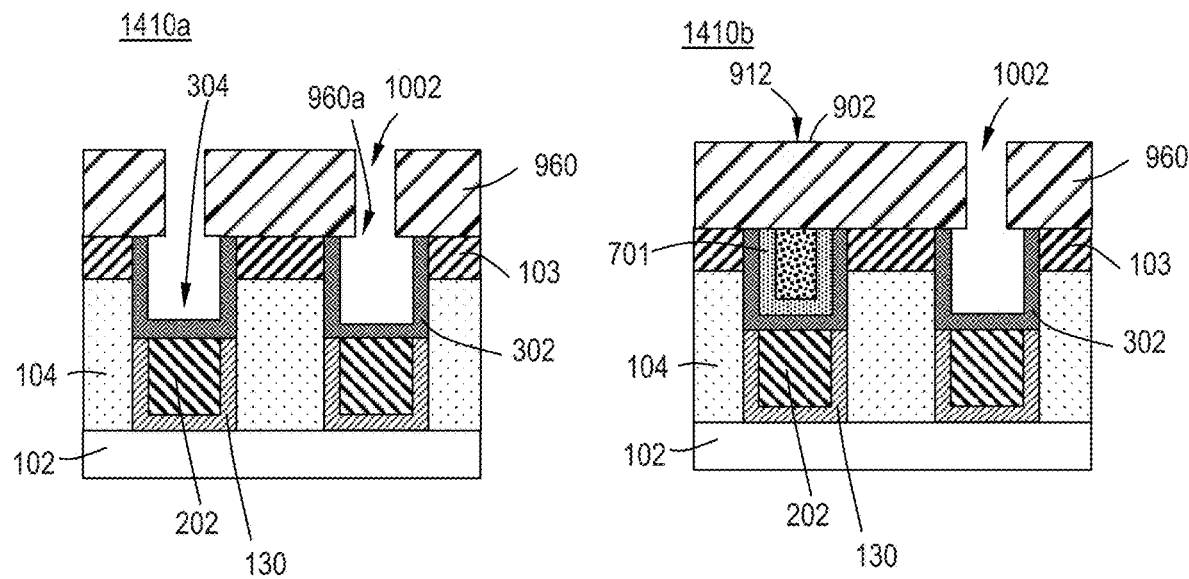
FIG. 14B
FIG. 14C

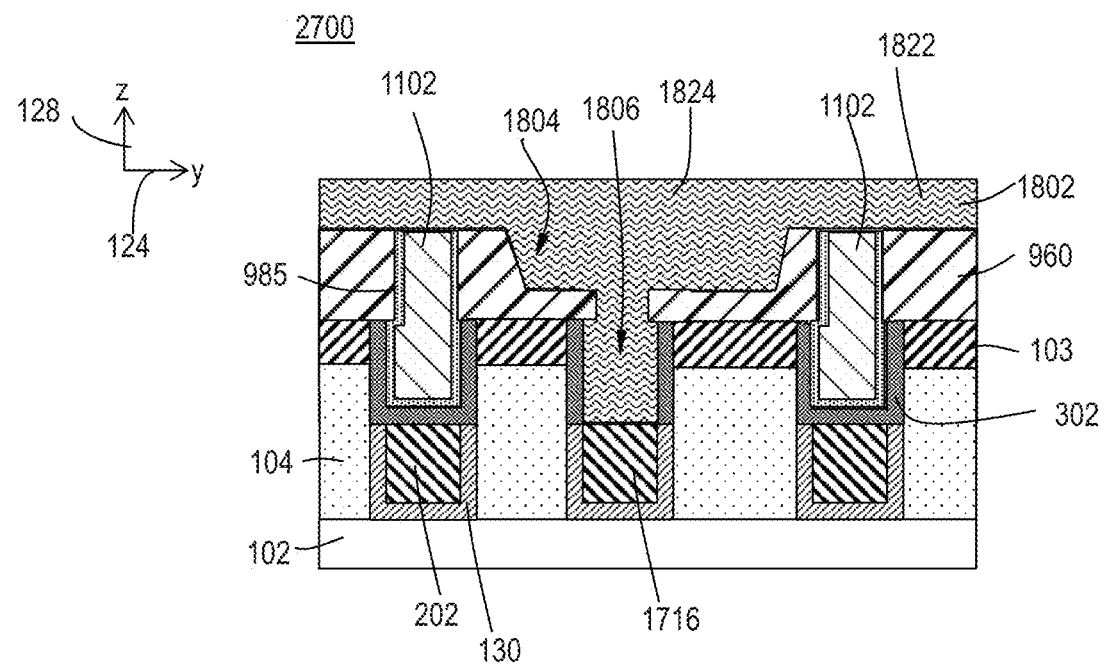
FIG. 27A
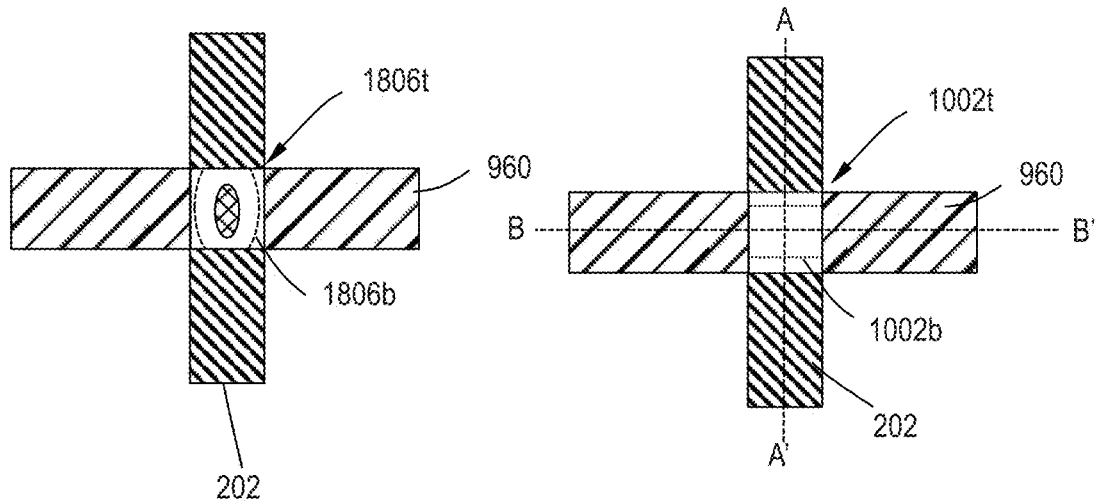
FIG. 27B
FIG. 27C

FULLY SELF-ALIGNED VIA

CROSS-REFERENCE TO RELATED APPLICATIONS

This application claims priority to U.S. Provisional Application No. 62/905,537, filed Sep. 25, 2019, and claims priority to U.S. Provisional Application No. 62/909,420, filed Oct. 2, 2019, the entire disclosures of which are hereby incorporated by reference herein.

TECHNICAL FIELD

Embodiments of the present disclosure pertain to the field of electronic device manufacturing, and in particular, to an integrated circuit (IC) manufacturing. More particularly, embodiments of the disclosure are directed to methods of producing self-aligned vias, and to methods of engineering the shape of a via to control via resistance.

BACKGROUND

Generally, an integrated circuit (IC) refers to a set of electronic devices, e.g., transistors formed on a small chip of semiconductor material, typically, silicon. Typically, the IC includes one or more layers of metallization having metal lines to connect the electronic devices of the IC to one another and to external connections. Typically, layers of the interlayer dielectric material are placed between the metallization layers of the IC for insulation.

As the size of the IC decreases, the spacing between the metal lines decreases. Typically, to manufacture an interconnect structure, a planar process is used that involves aligning and connecting one layer of metallization to another layer of metallization.

Typically, patterning of the metal lines in the metallization layer is performed independently from the vias above that metallization layer. Conventional via manufacturing techniques, however, cannot provide the full via self-alignment. In the conventional techniques, the vias formed to connect lines in an upper metallization layer to a lower metallization are often misaligned to the lines in the lower metallization layer. The via-line misalignment increases via resistance and leads to potential shorting to the wrong metal line. The via-line misalignment causes device failures, decreases yield and increases manufacturing cost. Additionally, conventional methods of manufacture require high aspect ratio etch, which leads to limited performance and throughput, and conventional methods can cause damage to the dielectric materials. Thus, there is a need for a method of making a via and/or via pillar that causes no damage to the dielectric material(s) and does not need a high aspect ratio dielectric etch.

Reducing the resistance of the via is critical for improved performance of the electronic device. The via resistance reduction is usually controlled by reducing the resistivity of the via material. Thus, there is a need for a method reducing via resistance.

SUMMARY

Apparatuses and methods to provide a fully self-aligned via are described. In one or more embodiments, a method to provide a fully self-aligned via is described. First conductive lines are deposited in at least one trench formed in a capping layer and a first insulating layer on a substrate, the first conductive lines extending along a first direction on the first insulating layer. The first conductive lines are recessed, a top surface of the recessed conductive lines recessed below a top surface of the capping layer on the first insulating layer. Pillars are formed on the recessed first conductive lines. A second insulating layer is deposited between the pillars. The pillars are removed to form trenches in the second insulating layer. A third insulating layer is deposited through the trenches onto the recessed first conductive lines. The third insulating layer is etched selectively relative to the second insulating layer to form a via opening down to one of the first conductive lines. In one or more embodiments, the via open has a tapering angle in a range of from about 60° to about 120°.

One or more embodiments are directed to an electronic device. In one or more embodiments and electronic device comprises: a first metallization layer comprising a set of first conductive lines extending along a first direction on a first insulating layer on a substrate, the set of first conductive lines recessed below a top portion of the first insulating layer; a capping layer on the first insulating layer; a second insulating layer on the capping layer; a second metallization layer comprising a set of second conductive lines on the second insulating layer and on a third insulating layer above the first metallization layer, the set of second conductive lines extending along a second direction that crosses the first direction at an angle; and at least one via between the first metallization layer and the second metallization layer, the at least one via having a trench portion that is a part of one of the second conductive lines and a via portion underneath the trench portion, the trench portion having a width along the second direction greater than the width along the second direction of the via portion, wherein the at least one via is self-aligned along the second direction to one of the first conductive lines and the at least one via is self-aligned along the first direction to one of the second conductive lines, the second direction crossing the first direction at an angle. In one or more embodiments, the via open has a tapering angle in a range of from about 60° to about 120°.

In one or more embodiments, a processor-implemented method for forming fully self-aligned vias is described. The method comprises: receiving data for a first configuration to control depositing first conductive lines in at least one trench formed in a capping layer and a first insulating layer on a substrate, the first conductive lines extending along a first direction on the first insulating layer; receiving data for a second configuration to control recessing the first conductive lines, a top surface of the recessed conductive lines recessed below a top surface of a capping layer on the first insulating layer; receiving data for a third configuration to control forming pillars on the recessed first conductive lines; receiving data for a fourth configuration to control depositing a second insulating layer between the pillars; receiving data for a fifth configuration to control removing the pillars to form trenches in the second insulating layer; receiving data for a sixth configuration to control depositing a third insulating layer through the trenches onto the recessed first conductive lines; receiving data for a seventh configuration to control etching the third insulating layer selectively relative to the second insulating layer to form a fully self-aligned via opening down to one of the recessed first conductive lines; and performing one or more of the first configuration, second configuration, third configuration, fourth configuration, fifth configuration, sixth configuration, or seventh configuration. In one or more embodiments, the via opening has a tapering angle in a range of from about 60° to about 120°.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments. The embodiments as described herein are illustrated by way of example and not limitation in the figures of the accompanying drawings in which like references indicate similar elements.

FIG. 11A illustrates a perspective view of an electronic device structure to provide a fully self-aligned via according to one or more embodiment;

FIG. 11B illustrates a cross-sectional view of the electronic device structure of FIG. 11B;

FIG. 11C illustrates an enlarged cross-sectional view of a portion of the electronic device of FIG. 11B;

FIG. 14A illustrates a perspective view of an electronic device structure to provide a fully self-aligned via according to one or more embodiment;

FIG. 14B illustrates a cross-sectional view of the electronic device structure of FIG. 14B;

FIG. 14C illustrates a cross-section view of the electronic device of FIG. 14A according to an alternative embodiment;

FIG. 27A illustrates a cross-sectional view of an electronic device structure to provide a fully self-aligned via according to one or more embodiment;

FIG. 27B illustrates a top view of the electronic device of FIG. 27A according to one or more embodiments;

FIG. 27C illustrates a top view of the electronic device of FIG. 27A according to one or more embodiments.

DETAILED DESCRIPTION

Figure 1A:
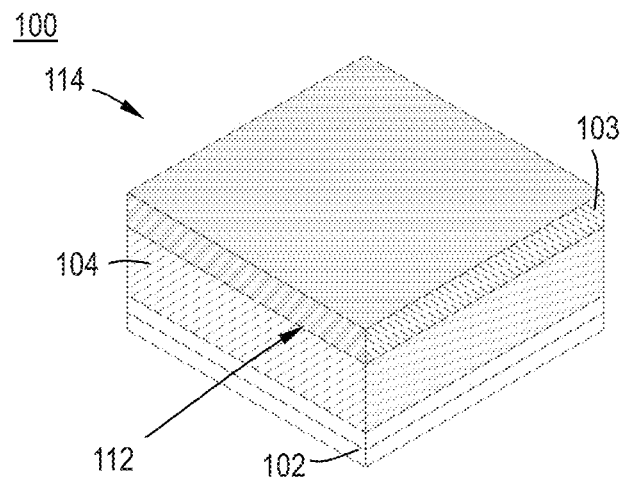
FIG. 1A illustrates a perspective view of an electronic device structure to provide a fully self-aligned via according to one or more embodiment.

Before describing several exemplary embodiments of the disclosure, it is to be understood that the disclosure is not limited to the details of construction or process steps set forth in the following description. The disclosure is capable of other embodiments and of being practiced or being carried out in various ways.

A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, amorphous silicon, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate, anneal and/or bake the substrate surface. In addition to film processing directly on the surface of the substrate itself, in the present disclosure, any of the film processing steps disclosed may also be performed on an under-layer formed on the substrate as disclosed in more detail below, and the term "substrate surface" is intended to include such under-layer as the context indicates. Thus for example, where a film/layer or partial film/layer has been deposited onto a substrate surface, the exposed surface of the newly deposited film/layer becomes the substrate surface.

As used in this specification and the appended claims, the terms "precursor", "reactant", "reactive gas" and the like are used interchangeably to refer to any gaseous species that can react with the substrate surface.

As used in this specification and the appended claims, the term "about" refers to a range of values ±10% of a specified value. For example, "about 60°" includes ±10% of 60° or from 53° to 66°. Likewise, "about 120°" includes ±10% of 120° or from 108° to 132°, and "about 30%" includes ±10% of 30% or from 27% to 33%, and "about 10 nm" includes ±10% of 10 nm or from 9 nm to 11 nm.

Apparatuses and methods to provide a fully self-aligned via are described. In one or more embodiments, a method to provide a fully self-aligned via is described. A set of first conductive lines on a first insulating layer on a substrate are recessed. The first conductive lines extend along a first direction on the first insulating layer. A top surface of the recessed conductive lines is recessed below a top surface of a capping layer on the first insulating layer. Pillars are formed on the recessed conductive lines. A second insulating layer is deposited between the pillars. The pillars are removed to form trenches in the second insulating layer. A third insulating layer is deposited through the trenches onto the first recessed conductive lines. The third insulating layer is etched selectively relative to the second insulating layer to form a via opening down to one of the first conductive lines.

In one or more embodiments, the via is self-aligned along the first direction to one of the second conductive lines, the second direction crossing the first directed at an angle.

In one or more embodiments, a fully self-aligned via is the via that is self-aligned along at least two directions to the conductive lines in a lower (or first) and an upper (or second) metallization layer. In one or more embodiments, the fully self-aligned via is defined by a hard mask in one direction and the underlying insulating layer in another direction, as described in further detail below.

Apparatuses and methods to provide a fully self-aligned via having reduced via resistance are described. A set of first conductive lines on a first insulating layer on a substrate are recessed. The first conductive lines extend along a first directed on the first insulating layer. A top surface of the recessed conductive lines is recessed below a top surface of a capping layer on the first insulating layer. Pillars are formed on the recessed conductive lines. A second insulating layer is deposited between the pillars. The pillars removed to form trenches in the second insulating layer. A third insulating layer is deposited through the trenches onto the first recessed conductive lines. The third insulating layer is etched selectively relative to the second insulating layer to form a via opening down to one of the first conductive lines. In one or more embodiments, the via opening advantageously has a shape selected from one or more of oval, rectangular, rectangular with rounded edges, round, rhombus, square, or square with rounded edges.

In one or more embodiments, via resistance is reduced by changing the tapering angle of the via. Without intending to be bound by theory, it is been found that if a via, which is tapered on four sides is instead engineered to be tapered only on two sides (and rectangular on the other two side), the resistance reduces by nearly 50%. In one or more embodiments, reducing the taper angle on one side further, an additional reduction in via resistance of up to 62% is possible.

In one or more embodiments, the process flow reduces the resistance of the via by about 30%. This is due to the fact that the via is larger than a conventional via. In one or more embodiments, the via resistance is further reduced by changing the etch angle, while, at the same time, not increasing shorts and reliability concerns.

In one or more embodiments, the via is self-aligned along the first direction to one of the second conductive lines, the second direction crossing the first directed at an angle.

In one or more embodiments, a fully self-aligned via is the via that is self-aligned along at least two directions to the conductive lines in a lower (or first) and an upper (or second) metallization layer. In one or more embodiments, the fully self-aligned via is defined by a hard mask in one direction and the underlying insulating layer in another direction, as described in further detail below.

Comparing to conventional techniques, some embodiments advantageously provide fully self-aligned vias with minimized bowing of the side walls during metal recess, resulting in self-aligned vias that have substantially vertical side walls. As used herein, the term "substantially vertical" refers to the straight profile of the via's such that when one skilled in the art were to view the via from the top down, the via opening at the top would be the same width or only slightly greater, less than 10%, less than 5%, less than 2%, or less than 1%, than the width of the bottom of the via. In some embodiments, the fully self-aligned vias provide lower via resistance and capacitance benefits over the conventional vias. Some embodiments of the self-aligned vias provide full alignment between the vias and the conductive lines of the metallization layers that is substantially error free that advantageously increase the device yield and reduce the device cost. Additionally, some embodiments of the self-aligned vias provide a high aspect ratio for the fully self-aligned via. Furthermore, some embodiments of the fully self-aligned vias advantageously provide columns and vias which are straighter and have increased verticality compared to columns and vias produced by other methods.

In the following description, numerous specific details, such as specific materials, chemistries, dimensions of the elements, etc. are set forth in order to provide thorough understanding of one or more of the embodiments of the present disclosure. It will be apparent, however, to one of ordinary skill in the art that the one or more embodiments of the present disclosure may be practiced without these specific details. In other instances, semiconductor fabrication processes, techniques, materials, equipment, etc., have not been descried in great details to avoid unnecessarily obscuring of this description. Those of ordinary skill in the art, with the included description, will be able to implement appropriate functionality without undue experimentation.

While certain exemplary embodiments of the disclosure are described and shown in the accompanying drawings, it is to be understood that such embodiments are merely illustrative and not restrictive of the current disclosure, and that this disclosure is not restricted to the specific constructions and arrangements shown and described because modifications may occur to those ordinarily skilled in the art.

Reference throughout the specification to "one embodiment", "another embodiment", or "an embodiment" means that a particular feature, structure, or characteristic described in connection with the embodiment is included in a least one embodiment of the present disclosure. Thus, the appearance of the phrases "In one or more embodiments" or "in an embodiment" in various places throughout the specification are not necessarily all referring to the same embodiment of the disclosure. Furthermore, the particular features, structures, or characteristics may be combined in any suitable manner in one or more embodiments.

Figure 1B:
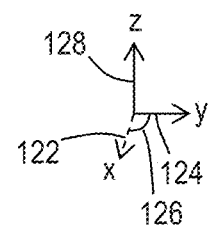
FIG. 1B illustrates a cross-sectional view of the electronic device structure of FIG. 1A.
Figure 1B:
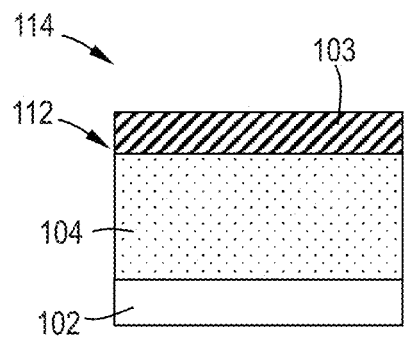

FIG. 1A illustrates a perspective view 100 of an electronic device 114 structure to provide a fully self-aligned via according to one or more embodiment. FIG. 1B illustrates a cross-sectional view 110 of the electronic device structure of FIG. 1A. An insulating layer 104 on a substrate 102 is provided. A capping layer 103 is deposited on the insulating layer 104. In one or more embodiments, the capping layer 103 may comprise any suitable material known to the skilled artisan. In a specific embodiment, the capping layer 103 comprises silicon nitride (SiN). The capping layer 103 has a thickness greater than 10 nm, including greater than 15 nm, or greater than 20 nm.

Figure 2A:
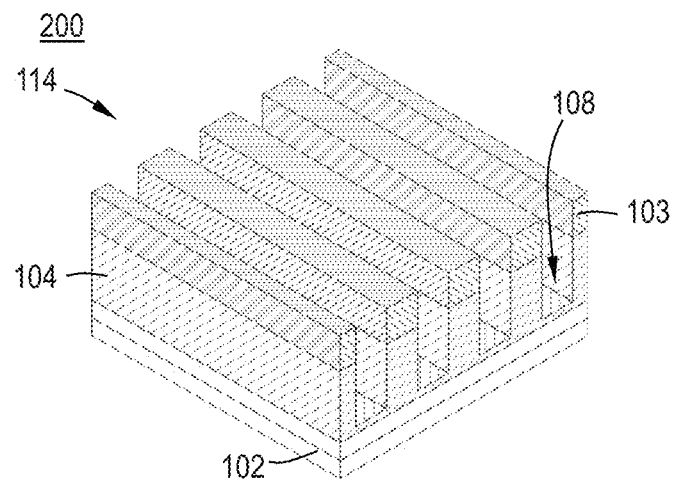
FIG. 2A illustrates a perspective view of an electronic device structure to provide a fully self-aligned via according to one or more embodiment.
Figure 2B:
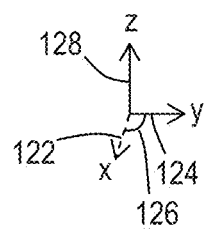
FIG. 2B illustrates a cross-sectional view of the electronic device structure of FIG. 2A.
Figure 2B:
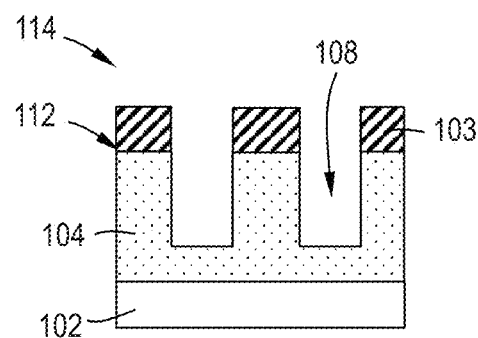

FIG. 2A illustrates a perspective view 200 of an electronic device 114 structure to provide a fully self-aligned via according to one or more embodiment. FIG. 2B illustrates a cross-sectional view 210 of the electronic device structure of FIG. 2A. Referring to FIGS. 2A and 2B, trenches 108 are formed in the insulating layer 104 and the capping layer 103.

Figure 3A:
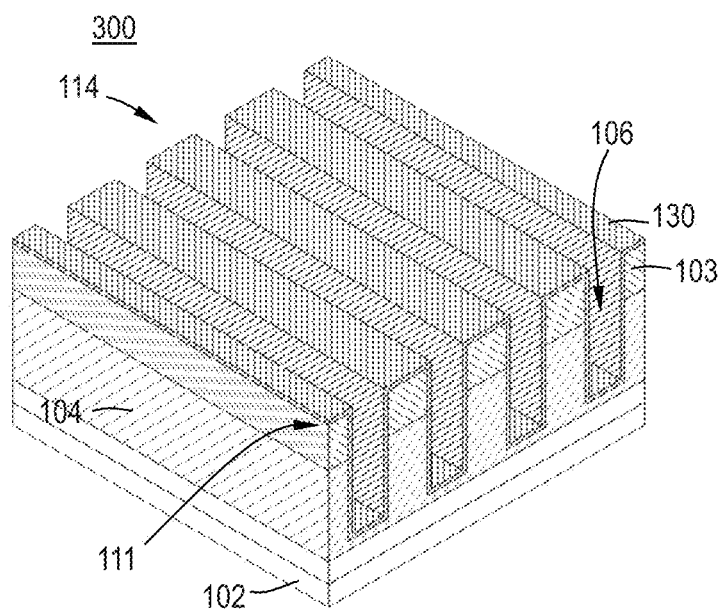
FIG. 3A illustrates a perspective view of an electronic device structure to provide a fully self-aligned via according to one or more embodiment.
Figure 3B:
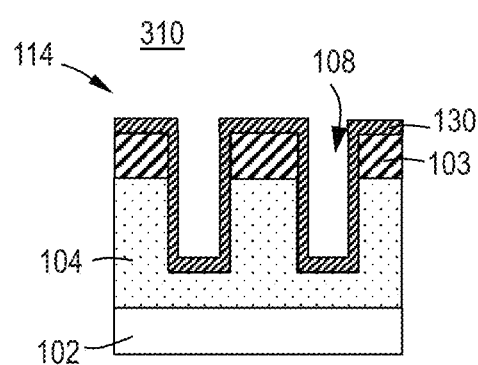
FIG. 3B illustrates a cross-sectional view of the electronic device structure of FIG. 3A.

FIG. 3A illustrates a perspective view 300 of an electronic device 114 structure to provide a fully self-aligned via according to one or more embodiment. FIG. 3B illustrates a cross-sectional view 310 of the electronic device structure of FIG. 3A. In one or more embodiments, a conformal first liner 130 is deposited on a top surface 111 of the capping layer 103 and on a top surface 112 of the insulating layer 104. The conformal first liner 130 is deposited prior to filling the trenches 108 with a layer of conductive material.

As used herein, the term "conformal" or "conformally," refers to a layer that adheres to and uniformly covers exposed surfaces with a thickness having a variation of less than 1% relative to the average thickness of the film. For example, a 1,000 Å thick film would have less than 10 Å variations in thickness. This thickness and variation includes edges, corners, sides, and the bottom of recesses. For example, a conformal layer deposited by ALD in various embodiments of the disclosure would provide coverage over the deposited region of essentially uniform thickness on complex surfaces.

In one or more embodiments, the conformal first liner 130 comprises one or more of titanium nitride (TiN), titanium (Ti), tantalum (Ta), or tantalum nitride (TaN). In an embodiment, the conformal first liner 130 is deposited using an atomic layer deposition (ALD) technique. In one or more embodiments, the conformal first liner 130 is deposited using one of deposition techniques, such as but not limited to a CVD, PVD, MBE, MOCVD, spin-on, or other liner deposition techniques know to one of ordinary skill in the art of microelectronic device manufacturing. In one or more embodiments, the conformal first liner 130 may be selectively removed using one or more of the dry and/or wet etching techniques known to one of ordinary skill in the art of electronic device manufacturing.

Figure 4A:
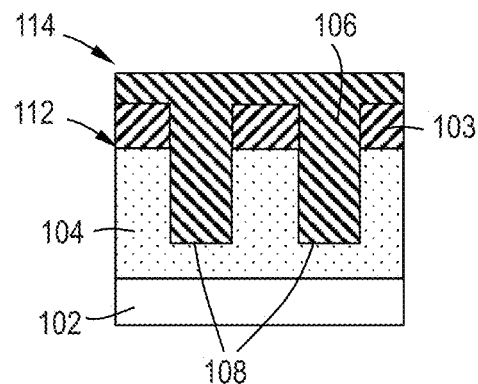
FIG. 4A illustrates a cross-sectional view of the electronic device structure according to one or more embodiments.
Figure 4B:
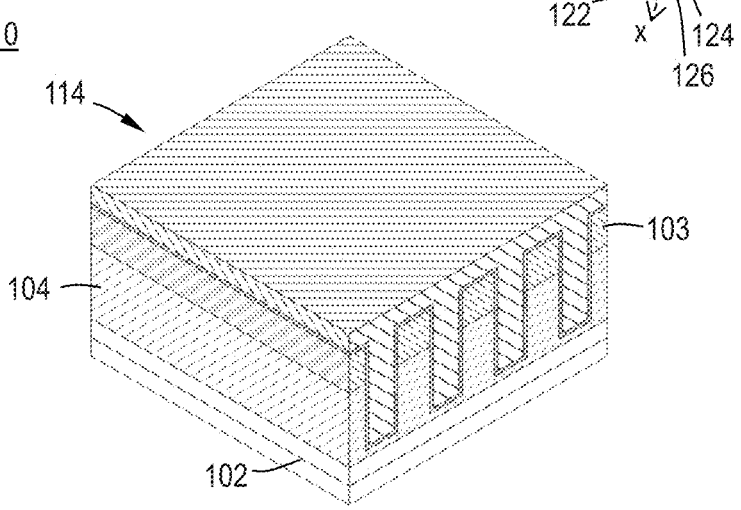
FIG. 4B illustrates a perspective view of an electronic device structure to provide a fully self-aligned via according to one or more embodiment.
Figure 4C:
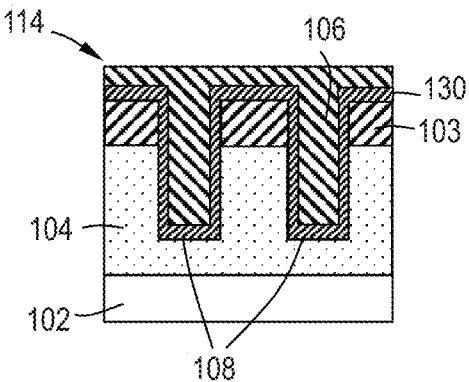
FIG. 4C illustrates a cross-sectional view of the electronic device structure of FIG. 4B.

FIG. 4A illustrates cross-sectional view 400 of an electronic device 114 according to one or more embodiments. FIG. 4B illustrates a perspective view 410 of an electronic device 114 structure to provide a fully self-aligned via according to one or more embodiment. FIG. 4C illustrates a cross-sectional view 420 of the electronic device structure of FIG. 4A with a conformal first liner 130.

Referring to FIGS. 4A to 4C, a lower metallization layer ($M_x$) comprises a set of conductive lines 106 that extend along an X axis (direction) 122 on a capping layer 103 and an insulating layer 104 on a substrate 102. The X axis of FIGS. 4A and 4C extends orthogonally to the plane of the Figure page. As shown in FIG. 4A, X axis (direction) 122 crosses Y axis (direction) 124 at an angle 126. In one or more embodiments, angle 126 is about 90 degrees. In another embodiment, angle 126 is an angle that is other than a 90 degree angle. In some embodiments, the angle 126 is in the range of from about 45 degrees to about 75 degrees. The insulating layer 104 comprises trenches 108. The conductive lines 106 are deposited on the capping layer 103 and in trenches 108. As illustrated in FIG. 4A, conformal first liner 130 can be absent. In one or embodiments, conformal first liner 130 is present and conductive lines 106 are deposited on conformal first liner 130. For descriptive purposes, the conformal first liner 130 is shown in the remaining Figures but it will be understood that the liner can be omitted.

The conformal first liner 130 can be any suitable material or combination of materials. In some embodiments, the conformal first liner 130 comprises a lamination of different materials that include one or more of diffusion barriers or adhesion layers.

In one or more embodiments, the substrate 102 comprises at least one semiconductor material, e.g., silicon (Si), carbon (C), germanium (Ge), silicon germanium (SiGe), gallium arsenide (GaAs), indium phosphide (InP), indium gallium arsenide (InGaAs), aluminum indium arsenide (InAlAs), other semiconductor material, or any combination thereof. In an embodiment, substrate 102 is a semiconductor-on-isolator (SOI) substrate including a bulk lower substrate, a middle insulation layer, and a top monocrystalline layer. The top monocrystalline layer may comprise any material listed above, e.g., silicon. In various embodiments, the substrate 102 can be, e.g., an organic, a ceramic, a glass, or a semiconductor substrate. Although a few examples of materials from which the substrate 102 may be formed are described here, any material that may serve as a foundation upon which passive and active electronic devices (e.g., transistors, memories, capacitors, inductors, resistors, switches, integrated circuits, amplifiers, optoelectronic devices, or any other electronic devices) may be built falls within the spirit and scope of the present disclosure.

In one or more embodiments, substrate 102 includes one or more metallization interconnect layers for integrated circuits. In at least some embodiments, the substrate 102 includes interconnects, for example, vias, configured to connect the metallization layers. In at least some embodiments, the substrate 102 includes electronic devices, e.g., transistors, memories, capacitors, resistors, optoelectronic devices, switches, and any other active and passive electronic devices that are separated by an electrically insulating layer, for example, an interlayer dielectric, a trench insulation layer, or any other insulating layer known to one of ordinary skill in the art of the electronic device manufacturing. In one or more embodiments, the substrate 102 includes one or more layers above substrate 102 to confine lattice dislocations and defects.

Insulating layer 104 can be any material suitable to insulate adjacent devices and prevent leakage. In one or more embodiments, electrically insulating layer 104 is an oxide layer, e.g., silicon dioxide, or any other electrically insulating layer determined by an electronic device design. In one or more embodiments, insulating layer 104 comprises an interlayer dielectric (ILD). In one or more embodiments, insulating layer 104 is a low-κ dielectric that includes, but is not limited to, materials such as, e.g., silicon dioxide, silicon oxide, carbon doped oxide ("CDO"), e.g., carbon doped silicon dioxide, porous silicon dioxide ($SiO_2$), silicon nitride (SiN), or any combination thereof.

In one or more embodiments, insulating layer 104 includes a dielectric material having a κ-value less than 5. In one or more embodiments, insulating layer 104 includes a dielectric material having a κ-value less than 2. In at least some embodiments, insulating layer 104 includes oxides, carbon doped oxides, porous silicon dioxide, carbides, oxycarbides, nitrides, oxynitrides, oxycarbonitrides, polymers, phosphosilicate glass, fluorosilicate (SiOF) glass, organosilicate glass (SiOCH), or any combinations thereof, other electrically insulating layer determined by an electronic device design, or any combination thereof. In at least some embodiments, insulating layer 104 may include polyimide, epoxy, photodefinable materials, such as benzocyclobutene (BCB), and WPR-series materials, or spin-on-glass.

In one or more embodiments, insulating layer 104 is a low-κ interlayer dielectric to isolate one metal line from other metal lines on substrate 102. In one or more embodiments, the thickness of the insulating layer 104 is in an approximate range from about 10 nanometers (nm) to about 2 microns (μm).

In an embodiment, insulating layer 104 is deposited using one of deposition techniques, such as but not limited to a chemical vapor deposition ("CVD"), a physical vapor deposition ("PVD"), molecular beam epitaxy ("MBE"), metalorganic chemical vapor deposition ("MOCVD"), atomic layer deposition ("ALD"), spin-on, or other insulating deposition techniques known to one of ordinary skill in the art of microelectronic device manufacturing.

In one or more embodiments, the lower metallization layer $M_x$ comprising conductive lines 106 (i.e., metal lines) is a part of a back end metallization of the electronic device. In one or more embodiments, the insulating layer 104 is patterned and etched using a hard mask to form trenches 108 using one or more patterning and etching techniques known to one of ordinary skill in the art of microelectronic device manufacturing. In one or more embodiments, the size of trenches 108 in the insulating layer 104 is determined by the size of conductive lines formed later on in a process.

In one or more embodiments, forming the conductive lines 106 involves filling the trenches 108 with a layer of conductive material. In one or more embodiments, a base layer (not shown) is first deposited on the internal sidewalls and bottom of the trenches 108, and then the conductive layer is deposited on the base layer. In one or more embodiments, the base layer includes a conductive seed layer (not shown) deposited on a conductive barrier layer (not shown). The seed layer can include copper (Cu), and the conductive barrier layer can include aluminum (Al), titanium (Ti), tantalum (Ta), tantalum nitride (TaN), and the like metals. The conductive barrier layer can be used to prevent diffusion of the conductive material from the seed layer, e.g., copper or cobalt, into the insulating layer 104. Additionally, the conductive barrier layer can be used to provide adhesion for the seed layer (e.g., copper).

In one or more embodiments, to form the base layer, the conductive barrier layer is deposited onto the sidewalls and bottom of the trenches 108, and then the seed layer is deposited on the conductive barrier layer. In another embodiment, the conductive base layer includes the seed layer that is directly deposited onto the sidewalls and bottom of the trenches 108. Each of the conductive barrier layer and seed layer may be deposited using any think film deposition technique known to one of ordinary skill in the art of semiconductor manufacturing, e.g., sputtering, blanket deposition, and the like. In one or more embodiments, each of the conductive barrier layer and the seed layer has the thickness in an approximate range from about 1 nm to about 100 nm. In one or more embodiments, the barrier layer may be a thin dielectric that has been etched to establish conductivity to the metal layer below. In one or more embodiments, the barrier layer may be omitted altogether and appropriate doping of the copper line may be used to make a "self-forming barrier".

In one or more embodiments, the conductive layer e.g., copper or cobalt, is deposited onto the seed layer of base layer of copper, by an electroplating process. In one or more embodiments, the conductive layer is deposited into the trenches 108 using a damascene process known to one of ordinary skill in the art of microelectronic device manufacturing. In one or more embodiments, the conductive layer is deposited onto the seed layer in the trenches 108 using a selective deposition technique, such as but not limited to electroplating, electrolysis, CVD, PVD, MBE, MOCVD, ALD, spin-on, or other deposition techniques know to one of ordinary skill in the art of microelectronic device manufacturing.

In one or more embodiments, the choice of a material for conductive layer for the conductive lines 106 determines the choice of a material for the seed layer. For example, if the material for the conductive lines 106 includes copper, the material for the seed layer also includes copper. In one or more embodiments, the conductive lines 106 include a metal, for example, copper (Cu), ruthenium (Ru), nickel (Ni), cobalt (Co), chromium (Cr), iron (Fe), manganese (Mn), titanium (Ti), aluminum (Al), hafnium (Hf), tantalum (Ta), tungsten (W), vanadium (V), molybdenum (Mo), palladium (Pd), gold (Au), silver (Ag), platinum (Pt), indium (In), tin (Sn), lead (Pd), antimony (Sb), bismuth (Bi), zinc (Zn), cadmium (Cd), or any combination thereof.

Figure 5A:
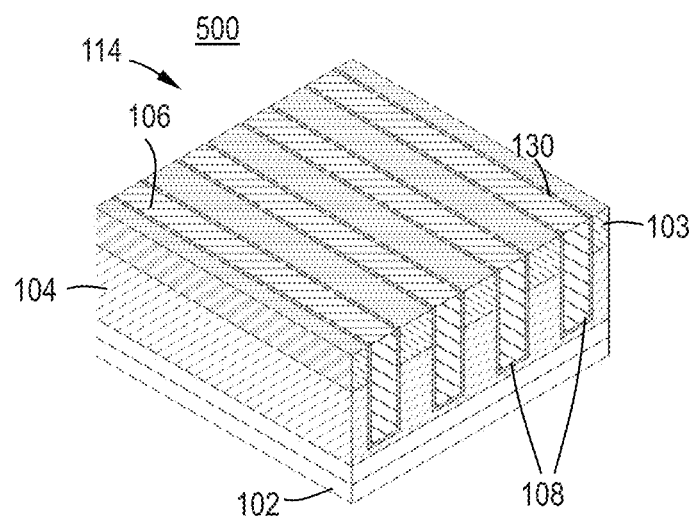
FIG. 5A illustrates a perspective view of an electronic device structure to provide a fully self-aligned via according to one or more embodiment.
Figure 5B:
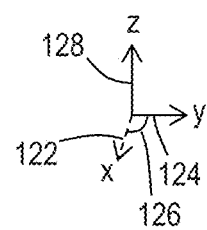
FIG. 5B illustrates a cross-sectional view of the electronic device structure of FIG. 5B.
Figure 5B:
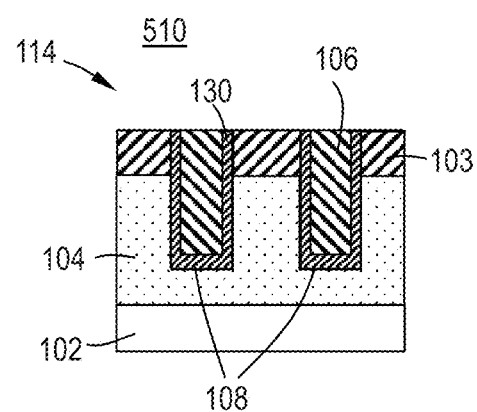

FIG. 5A illustrates a perspective view 500 of an electronic device 114 structure to provide a fully self-aligned via according to one or more embodiment. FIG. 5B illustrates a cross-sectional view 510 of the electronic device structure of FIG. 5A. In one or more embodiments, portions of the conductive lines 106 and the base layer are removed to even out top portions of the conductive lines 106 with top portions of the insulating layer 104 using a chemical-mechanical polishing ("CMP") technique known to one of ordinary skill in the art of microelectronic device manufacturing.

In one non-limiting example, the thickness (as measured along the z-axis of FIG. 5B) of the conductive lines 106 is in an approximate range from about 15 nm to about 1000 nm. In one non-limiting example, the thickness of the conductive lines 106 is from about 20 nm to about 200 nm. In one non-limiting example, the width (as measured along the y-axis of FIG. 5B) of the conductive lines 106 is in an approximate range from about 5 nm to about 500 nm. In one non-limiting example, the spacing (pitch) between the conductive lines 106 is from about 2 nm to about 500 nm. In more specific non-limiting example, the spacing (pitch) between the conductive lines 106 is from about 5 nm to about 50 nm.

In an embodiment, the lower metallization layer $M_x$ is configured to connect to other metallization layers (not shown). In an embodiment, the metallization layer $M_x$ is configured to provide electrical contact to electronic devices, e.g., transistor, memories, capacitors, resistors, optoelectronic devices, switches, and any other active and passive electronic devices that are separated by an electrically insulating layer, for example, an interlayer dielectric, a trench insulation layer, or any other insulating layer known to one of ordinary skill in the art of electronic device manufacturing.

Figure 6A:
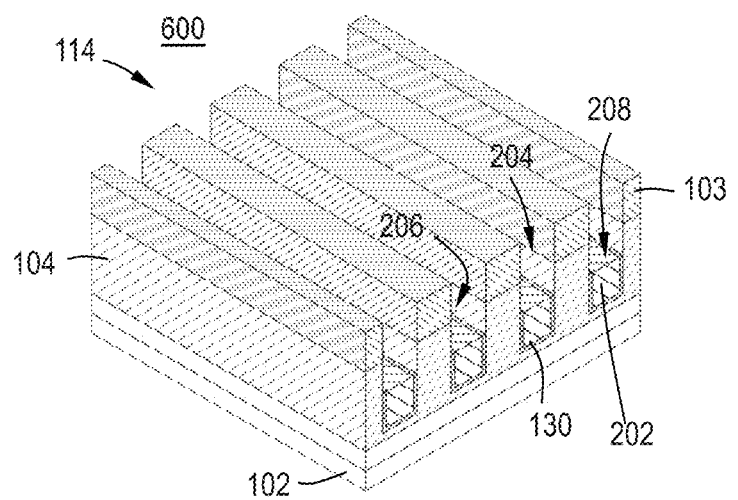
FIG. 6A illustrates a perspective view of an electronic device structure to provide a fully self-aligned via according to one or more embodiment.
Figure 6B:
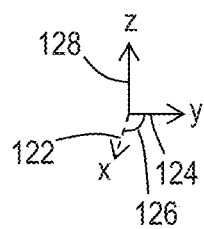
FIG. 6B illustrates a cross-sectional view of the electronic device structure of FIG. 6B.
Figure 6B:
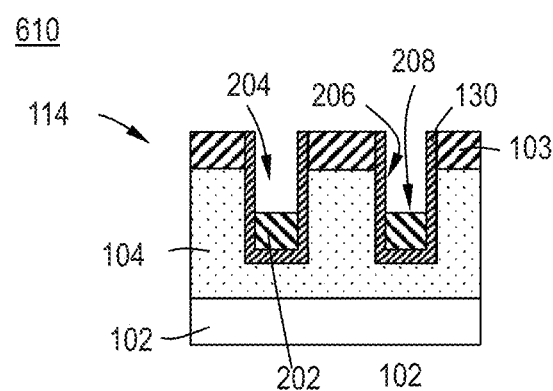

As recognized by one of skill in the art, while a conformal first liner 130 does not have to be present, in one or more of the subsequent embodiments, for ease of drawing, the liner has been included in the figures. FIG. 6A illustrates a perspective view 600 of an electronic device 114 structure to provide a fully self-aligned via according to one or more embodiment. FIG. 6B illustrates a cross-sectional view 610 of the electronic device structure of FIG. 6A. In one or more embodiments, the conductive lines 106 are recessed according to one or more embodiments. The conductive lines 106 are recessed to a predetermined depth to form recessed conductive lines 202. As shown in FIGS. 6A and 6B, trenches 204 are formed in the insulating layer 104 and capping layer 103. Each trench 204 has sidewalls 206 that are portions of capping layer 103, insulating layer 104, and, if present, conformal first liner 130, and a bottom that is a top surface 208 of the recessed conductive lines 202.

In one or more embodiments, the depth of the trenches 204 is from about 10 nm to about 500 nm. In one or more embodiments, the depth of the trenches 204 is from about 10% to about 100% of the thickness of the conductive lines. In one or more embodiments, the conductive lines 106 are recessed using one or more of wet etching, dry etching, or a combination thereof techniques known to one of ordinary skill in the art of electronic device manufacturing.

Figure 7A:
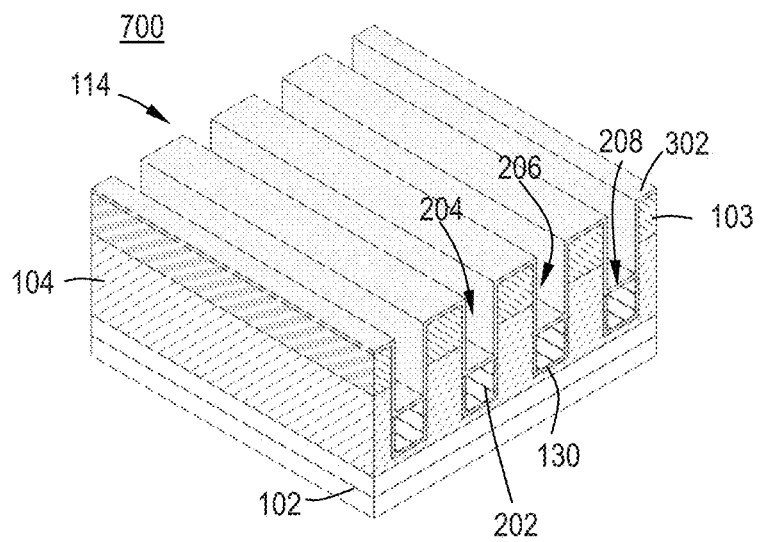
FIG. 7A illustrates a perspective view of an electronic device structure to provide a fully self-aligned via according to one or more embodiment.
Figure 7B:
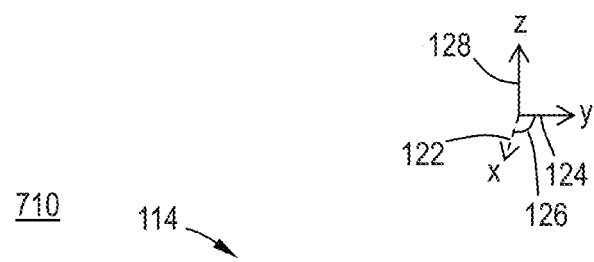
FIG. 7B illustrates a cross-sectional view of the electronic device structure of FIG. 7B.
Figure 7B:
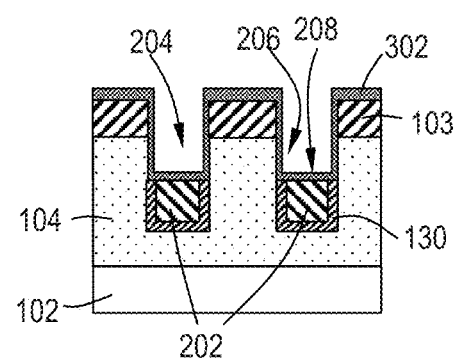

FIG. 7A illustrates a perspective view 700 of an electronic device 114 structure to provide a fully self-aligned via according to one or more embodiment. FIG. 7B illustrates a cross-sectional view 710 of the electronic device structure of FIG. 7A. In one or more embodiments, a conformal first liner 130 is deposited on a top surface 112 of the insulating layer 104. The conductive lines 106 are recessed to a predetermined depth to form recessed conductive lines 202. In one or more embodiments, trenches 204 are formed in the insulating layer 104 and capping layer 103. Each trench 204 has sidewalls 206 that are portions of capping layer 103, insulating layer 104, and a bottom that is conformal first liner 130.

In one or more embodiments, the depth of the trenches 204 is from about 10 nm to about 500 nm. In one or more embodiments, the depth of the trenches 204 is from about 10% to about 100% of the thickness of the conductive lines. In one or more embodiments, the conductive lines 106 are recessed using one or more of wet etching, dry etching, or a combination thereof techniques known to one of ordinary skill in the art of electronic device manufacturing.

Referring to FIGS. 7A and 7B, in one or more embodiments, a conformal second liner 302 is deposited on the recessed conductive lines 202. In some embodiments, the conformal second liner 302 is deposited on the sidewalls 206 of the trenches 204. In one or more embodiments, the conformal second liner 302 is deposited on the sidewalls 206 of the trenches 204 and on the recessed conductive lines 202.

In one or more embodiments, conformal second liner 302 is deposited to protect the recessed conductive lines 202 from changing properties later on in a process (e.g., during tungsten deposition, or other processes). In one or more embodiments, conformal second liner 302 is a conductive liner. In another embodiment, conformal second liner 302 is a non-conductive liner. In one or more embodiments, when conformal second liner 302 is a non-conductive liner, the conformal second liner 302 is removed later on in a process, as described in further detail below. In one or more embodiments, conformal second liner 302 includes titanium nitride (TiN), titanium (Ti), tantalum (Ta), tantalum nitride (TaN), or any combination thereof. In another embodiment, conformal second liner 302 is an oxide, e.g., aluminum oxide ($Al_2O_3$), titanium oxide ($TiO_2$). In yet another embodiment, conformal second liner 302 is a nitride, e.g., silicon nitride (SiN) or silicon carbonitride (SiCN). In one or more embodiments, the conformal second liner 302 is deposited to a thickness from about 0.5 nm to about 10 nm.

In one or more embodiments, the conformal second liner 302 is deposited using an atomic layer deposition (ALD) technique. In one or more embodiments, the conformal second liner 302 is deposited using one of deposition techniques, such as but not limited to a CVD, PVD, MBE, MOCVD, spin-on, or other liner deposition techniques know to one of ordinary skill in the art of microelectronic device manufacturing. In one or more specific embodiments, the conformal second liner 302 comprises silicon nitride (SiN) and is deposited by atomic layer deposition.

Figure 8A:
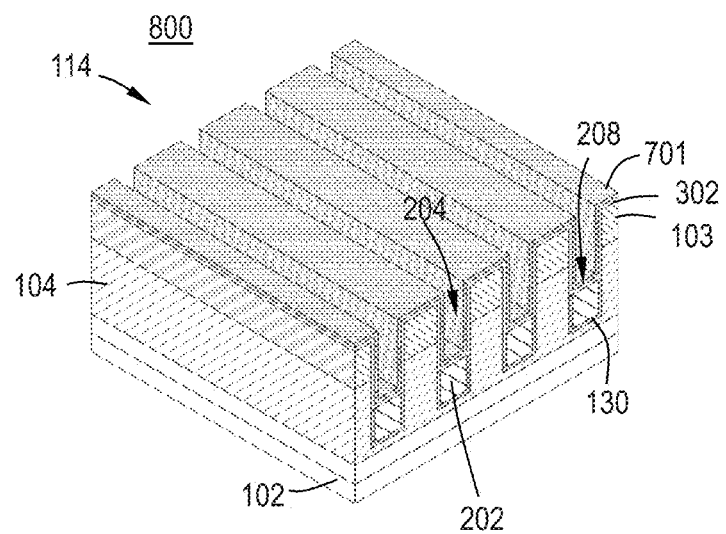
FIG. 8A illustrates a perspective view of an electronic device structure to provide a fully self-aligned via according to one or more embodiment.
Figure 8B:
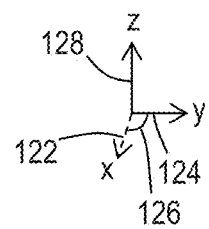
FIG. 8B illustrates a cross-sectional view of the electronic device structure of FIG. 8B.
Figure 8B:
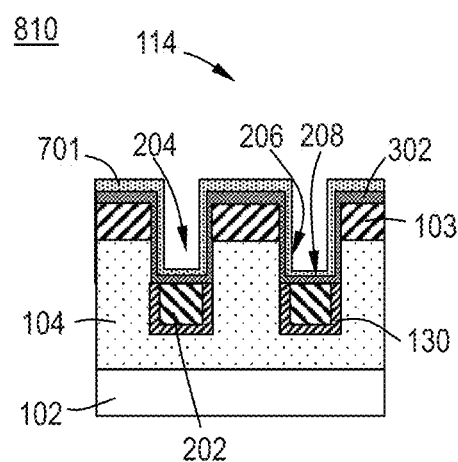

FIG. 8A illustrates a perspective view 800 of an electronic device 114 structure to provide a fully self-aligned via according to one or more embodiment. FIG. 8B illustrates a cross-sectional view 810 of the electronic device structure of FIG. 8A. In one or more embodiments, a conformal third liner 701 has been deposited on conformal second liner 302. Conformal third liner 701 may be deposited by any deposition technique known to one of skill in the art. In one or more embodiments, conformal third liner 701 is deposited and present. In other embodiments, conformal third liner 701 is not deposited.

In one or more embodiments, the conformal third liner 701 comprises one or more of titanium nitride (TiN), titanium (Ti), tantalum (Ta), or tantalum nitride (TaN). In an embodiment, the conformal third liner 701 is deposited using an atomic layer deposition (ALD) technique. In one or more embodiments, the conformal third liner 701 is deposited using one of deposition techniques, such as but not limited to a CVD, PVD, MBE, MOCVD, spin-on, or other liner deposition techniques know to one of ordinary skill in the art of microelectronic device manufacturing. In one or more embodiments, the conformal third liner 701 may be selectively removed using one or more of the dry and wet etching techniques known to one of ordinary skill in the art of electronic device manufacturing.

Figure 9A:
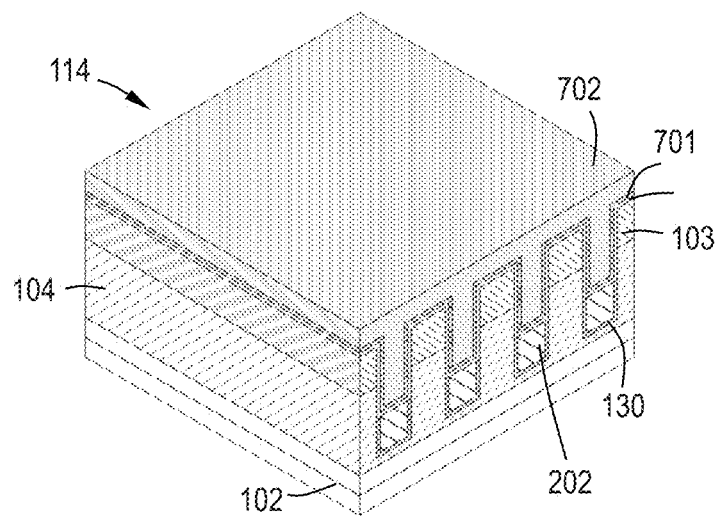
FIG. 9A illustrates a perspective view of an electronic device structure to provide a fully self-aligned via according to one or more embodiment.
Figure 9B:
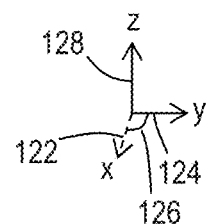
FIG. 9B illustrates a cross-sectional view of the electronic device structure of FIG. 9B.
Figure 9B:
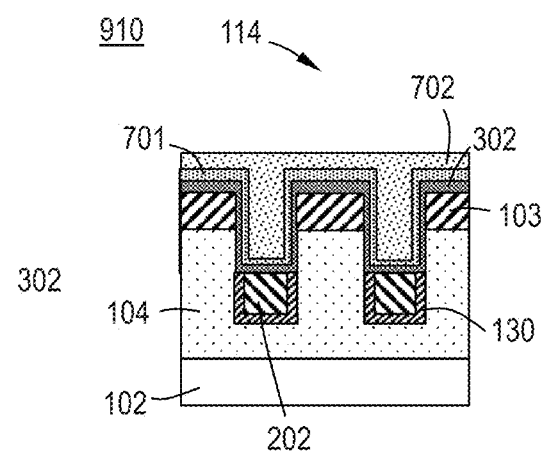

FIG. 9A illustrates a perspective view 900 of an electronic device 114 structure to provide a fully self-aligned via according to one or more embodiment. FIG. 9B illustrates a cross-sectional view 910 of the electronic device structure of FIG. 9A. In one or more embodiments, a gapfill layer 702 is deposited on the recessed conductive lines 202 (or on the conformal second liner 302, if present, or on the conformal third liner 701, if present), the capping layer 103, and a portion of the insulating layer 104, according to one or more embodiments. As illustrated, gapfill layer 702 is deposited on conformal second liner 302 (or on conformal third liner 701, if present) on the top surface 208 of the recessed conductive lines 202, the sidewalls 206 of the trenches 204, capping layer 103, and top portions of the insulating layer 104. In one or more embodiments, gapfill layer 702 is a tungsten (W) layer, or other gapfill layer to provide selective growth pillars. In some embodiments, gapfill layer 702 is a metal film or a metal containing film. In one or more embodiments, suitable metal films include, but are not limited to metals having a Pilling-Bedworth ratio greater than 2, greater than 2.25, or greater than 2.5. As used herein, the term "Pilling-Bedworth ratio" refers to a ratio of a volume of the elementary cell of a metal oxide or metal nitride to the volume of the elementary cell of the corresponding metal from which the oxide or nitride is formed. The Pilling-Bedworth ratio is also recognized to those of skill in the art as the volumetric expansion coefficient. The Pilling-Bedworth ratio is defined as the $V_{oxide}/V_{metal}$ or $V_{nitride}/V_{metal}$, where V is volume. For determining the Pilling-Bedworth ratio of a metal oxide, $V_{oxide}$ equals the molecular mass of the of the metal oxide multiplied by the density of the metal, and $V_{metal}$ equals the number of atoms of metal per one molecule of the oxide multiplied by the atomic mass of the metal multiplied by the density of the oxide. For determining the Pilling-Bedworth ratio of a metal nitride, $V_{nitride}$ equals the molecular mass of the of the metal nitride multiplied by the density of the metal, and $V_{metal}$ equals the number of atoms of metal per one molecule of the nitride multiplied by the atomic mass of the metal multiplied by the density of the nitride. In one or more embodiments, the gapfill layer 702 includes one or more of cobalt (Co), molybdenum (Mo), tungsten (W), tantalum (Ta), titanium (Ti), ruthenium (Ru), rhodium (Rh), copper (Cu), iron (Fe), manganese (Mn), vanadium (V), niobium (Nb), hafnium (Hf), zirconium (Zr), yttrium (Y), aluminum (Al), tin (Sn), chromium (Cr), lanthanum (La), or any combination thereof. In some embodiments, seed gapfill layer 702 comprises is a tungsten (W) seed gapfill layer.

In some embodiments, the metal of the seed gapfill layer 702 has a Pilling-Bedworth ratio of greater than 2.5 (e.g. 2.7) and is selected from the group consisting of tungsten (W), molybdenum (Mo), osmium (Os), and vanadium (V). In some specific embodiments, the metal film comprises tungsten (W). Suitable metal containing films include derivatives of a metal film. Suitable derivatives of the metal film include, but are not limited to, nitride, boride, carbide, oxynitride, oxyboride, oxycarbide, carbonitride, borocarbide, boronitride, borocarbonitride, borooxycarbonitride, oxycarbonitride, borooxycarbide and borooxynitride. Those skilled in the art will understand that the metal film deposited may have a non-stoichiometric amount of atoms with the metal film. For example, a film designated as WN may have different amounts of tungsten and nitrogen. The WN film may be, for example, 90 atomic % tungsten. The use of WN to describe a tungsten nitride film means that the film comprises tungsten and nitrogen atoms and should not be taken as limiting the film to a specific composition. In some embodiments, the gapfill 702 consists essentially of the designated atoms. For example, a gapfill consisting essentially of tungsten (W) means that the composition of the film is greater than or equal to about 95%, 98% or 99% tungsten. In some embodiments, the gapfill 702 comprises tungsten.

In one or more embodiments, the gapfill layer 702 is deposited using one of deposition techniques, such as but not limited to an ALD, a CVD, PVD, MBE, MOCVD, spin-on or other liner deposition techniques known to one of ordinary skill in the art of microelectronic device manufacturing.

In some embodiments, deposition of the gapfill layer 702 includes formation of a seed gapfill layer (not shown). As will be understood by the skilled artisan, a seed gapfill layer is a relatively thin layer of material that can increase the nucleation rate (i.e., growth rate) of the gapfill layer 702. In some embodiments, the seed gapfill layer is the same material as the gapfill layer 702 deposited by a different technique. In some embodiments, the seed gapfill layer is a different material than the gapfill layer 702.

Figure 10A:
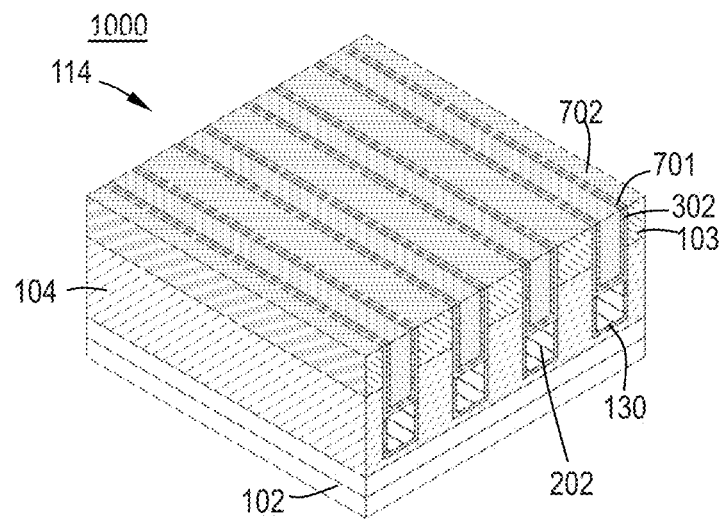
FIG. 10A illustrates a perspective view of an electronic device structure to provide a fully self-aligned via according to one or more embodiment.
Figure 10B:
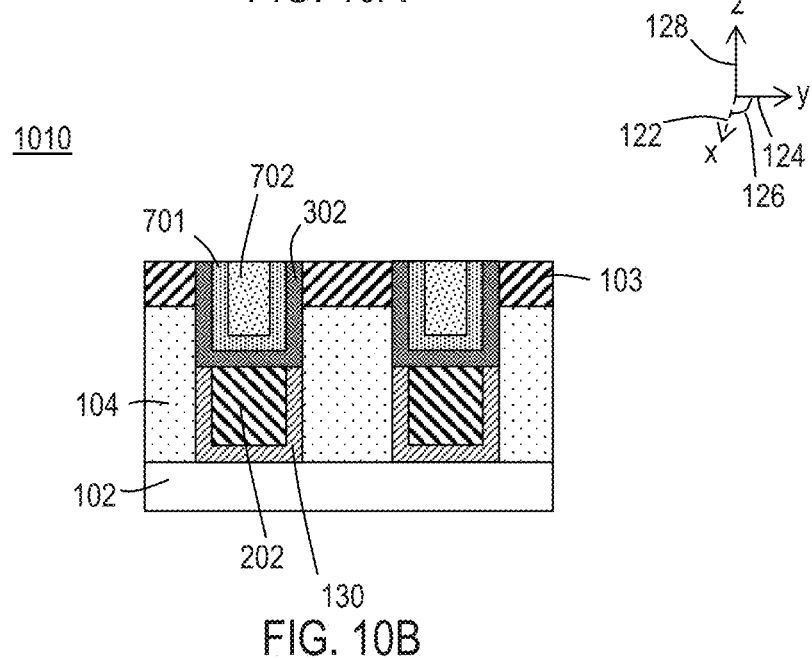
FIG. 10B illustrates a cross-sectional view of the electronic device structure of FIG. 10B.

FIG. 10A illustrates a perspective view 1000 of an electronic device 114 structure to provide a fully self-aligned via according to one or more embodiment. FIG. 10B illustrates a cross-sectional view 1010 of the electronic device structure of FIG. 10A. In one or more embodiments, portions of the seed gapfill layer 702 are removed to expose top portions of the capping layer 103. In one or more embodiments, the portions of the seed gapfill layer 702 are removed using one of the chemical-mechanical planarization (CMP) techniques known to one of ordinary skill in the art of microelectronic device manufacturing.

The formation of the gapfill layer 702 is described as using a bulk deposition of the gapfill material to form an overburden on the top of the substrate followed by planarization to remove the overburden. In some embodiments, the gapfill layer 702 is formed by a selective deposition process that forms substantially no (e.g., <5% area) overburden on the insulating layer 104.

FIG. 11A illustrates a perspective view 1100 of an electronic device 114 structure to provide a fully self-aligned via according to one or more embodiment. FIG. 11B illustrates a cross-sectional view 1110 of the electronic device structure of FIG. 11A. In one or more embodiments, self-aligned selective growth pillars 902 are formed using the seed gapfill layer 702 according to one or more embodiment. As shown in FIGS. 11A and 11B, an array of the self-aligned selective growth pillars 902 has the same pattern as the set of the recessed conductive lines 202. In one or more embodiments, the pillars 902 extend substantially orthogonally from the top surfaces of the recessed conductive lines 202. In one or more embodiments, the pillars 902 extend along the same direction as the recessed conductive lines 202. In one or more embodiments, the pillars 902 are separated by gaps 906.

As illustrated in FIG. 11C, which is exploded view 1120, the pillars 902 have a height 904 and are substantially vertical with substantially linear sidewalls 908. As used herein, the term "substantially vertical" refers to pillars having substantially linear sidewalls and a pillar width that varies only about 15% or less, including about 14%, about 13%, about 12%, about 11%, about 10%, about 9%, about 8%, about 7%, about 6%, about 5%, about 4%, about 3%, about 2%, and about 1% or less, between the bottom pillar width 922 and the top pillar width 924. As used herein, the term "substantially linear" means that a major plane formed by the sidewalls 908 of the pillars 902 meet the surface of the insulating layer 104 with a relative angle in the range of from about 80° to about 100°, or in the range of from about 85° to about 95°, or about 90°. While the terms "vertical", "verticality", and the like, are used to describe the shape of the sidewalls of the pillars, these terms are referring to the surface of the insulating layer 104 as the horizon. In some embodiments, the openings in the insulating layer from which the pillars are grown are at an angle other than normal to the surface. In embodiments of this sort, the pillars have sides that are linear and aligned with the sides of the openings. For example, if the trenches 108 are at an angle of 80 degrees to the surface of the capping layer 103, where 90 degrees is normal to the surface, the pillars extend from the trenches at the same angle of 80 degrees from the surface. In one or more embodiments, the pillars have a width in a range of from about 30 Å to about 5000 Å, including about 50 Å to about 4000 Å, about 30 Å to about 3000 Å, about 50 Å to about 2500 Å, about 50 Å to about 2000 Å, about 30 Å to about 1000 Å, or about 50 Å to about 500 Å.

In one or more embodiments, the pillars 902 are selectively grown from the gapfill layer 702 on portions of the capping layer 103 and on the recessed conductive lines 202, when the conformal second liner 302 and the conformal third liner 701 are present. In one or more embodiments, portions of the gapfill layer 702 above the recessed conductive lines 202 are expanded for example, by oxidation, nitridation, or other process to grow pillars 902. In one or more embodiments, the gapfill layer 702 is oxidized by exposure to an oxidizing agent or oxidizing conditions to transform the metal or metal containing gapfill layer 702 to metal oxide pillars 902. In one or more embodiments, pillars 902 include an oxide of one or more metals listed above. In more specific embodiments, pillars 902 include tungsten oxide (e.g., WO, $WO_3$ and other tungsten oxide).

The oxidizing agent can be any suitable oxidizing agent including, but not limited to, $O_2$, $O_3$, $N_2O$, $H_2O$, $H_2O_2$, CO, $CO_2$, $N_2$/Ar, $N_2$/He, $N_2$/Ar/He, ammonium persulphate, organic peroxide agents, such as meta-chloroperbenzoic acid and peracids (e.g. trifluoroperacetic acid, 2,4-dinitroperbenzoic acid, peracetic acid, persulfuric acid, percarbonic acid, perboric acid, and the like), or any combination thereof. In some embodiments, the oxidizing conditions comprise a thermal oxidation, plasma enhanced oxidation, remote plasma oxidation, microwave and radio-frequency oxidation (e.g., inductively coupled plasma (ICP), capacitively coupled plasma (CCP)).

In one or more embodiments, the pillars 902 are formed by oxidation of the seed gapfill layer at any suitable temperature depending on, for example, the composition of the seed gapfill layer and the oxidizing agent. In some embodiments, the oxidation occurs at a temperature in an approximate range of from about 25° C. to about 800° C. In some embodiments, the oxidation occurs at a temperature greater than or equal to about 150° C. In one or more embodiments, the seed layer comprises tungsten and wherein the pillars 902 are formed by oxidizing the seed layer to form tungsten oxide.

In one or more embodiments, the height 904 of the pillars 902 is in an approximate range from about 5 angstroms (Å) to about 10 microns (μm).

Figure 12A:
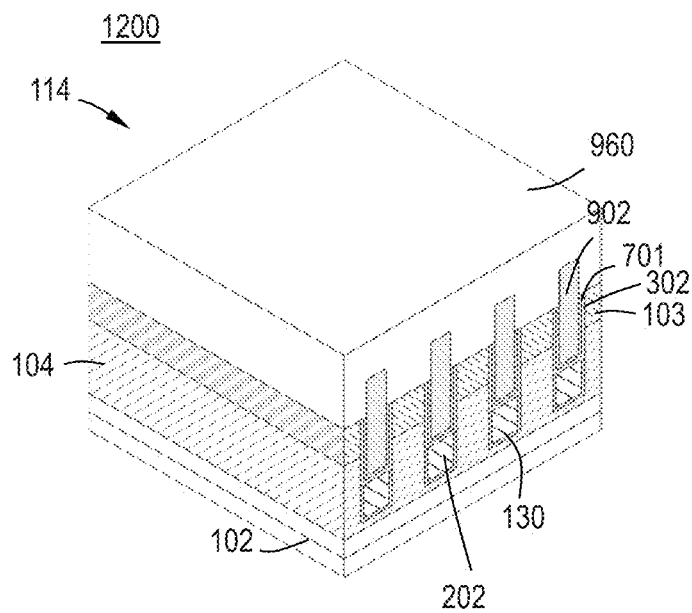
FIG. 12A illustrates a perspective view of an electronic device structure to provide a fully self-aligned via according to one or more embodiment.
Figure 12B:
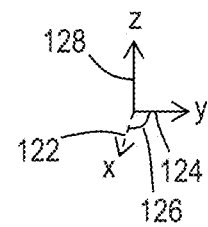
FIG. 12B illustrates a cross-sectional view of the electronic device structure of FIG. 12B.
Figure 12B:
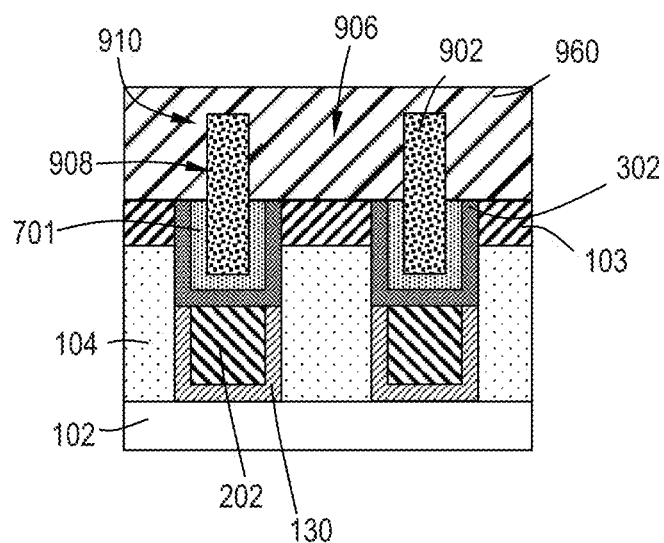

FIG. 12A illustrates a perspective view 1200 of an electronic device 114 structure to provide a fully self-aligned via according to one or more embodiment. FIG. 12B illustrates a cross-sectional view 1210 of the electronic device structure of FIG. 12A. In one or more embodiments, an insulating layer 960 is deposited to overfill the gaps 906 between the pillars 902. In one or more embodiments, insulating layer 960 is deposited on the opposing sidewalls 908 and top portions 910 of the pillars 902 and through the gaps 906 on the portions of the capping layer 103 and conformal second liner 302 and conformal third liner 701 between the pillars 902.

In one or more embodiments, insulating layer 960 is a low-κ gapfill layer. In one or more embodiments, insulating layer 960 is a flowable silicon oxide (FSiOx) layer. In at least some embodiments, insulating layer 960 is an oxide layer, e.g., silicon dioxide ($SiO_2$), or any other electrically insulating layer determined by an electronic device design. In one or more embodiments, insulating layer 960 is an interlayer dielectric (ILD). In one or more embodiments, insulating layer 960 is a low-κ dielectric that includes, but is not limited to, materials such as, e.g., silicon dioxide, silicon oxide, a carbon based material, e.g., a porous carbon film, carbon doped oxide ("CDO"), e.g. carbon doped silicon dioxide, porous silicon dioxide, porous silicon oxide carbide hydride (SiOCH), silicon nitride, or any combination thereof. In one or more embodiments, insulating layer 960 is a dielectric material having κ-value less than 3. In more specific embodiment, insulating layer 960 is a dielectric material having κ-value in an approximate range from about 2.2 to about 2.7. In one or more embodiments, insulating layer 960 includes a dielectric material having κ-value less than 2. In one or more embodiments, insulating layer 960 represents one of the insulating layers described above with respect to insulating layer 104.

In one or more embodiments, insulating layer 960 is a low-κ interlayer dielectric to isolate one metal line from other metal lines. In one or more embodiments, insulating layer 960 is deposited using one of deposition techniques, such as but not limited to a CVD, spin-on, an ALD, PVD. MBE, MOCVD, or other low-κ insulating layer deposition techniques known to one of ordinary skill in the art of microelectronic device manufacturing.

Figure 13A:
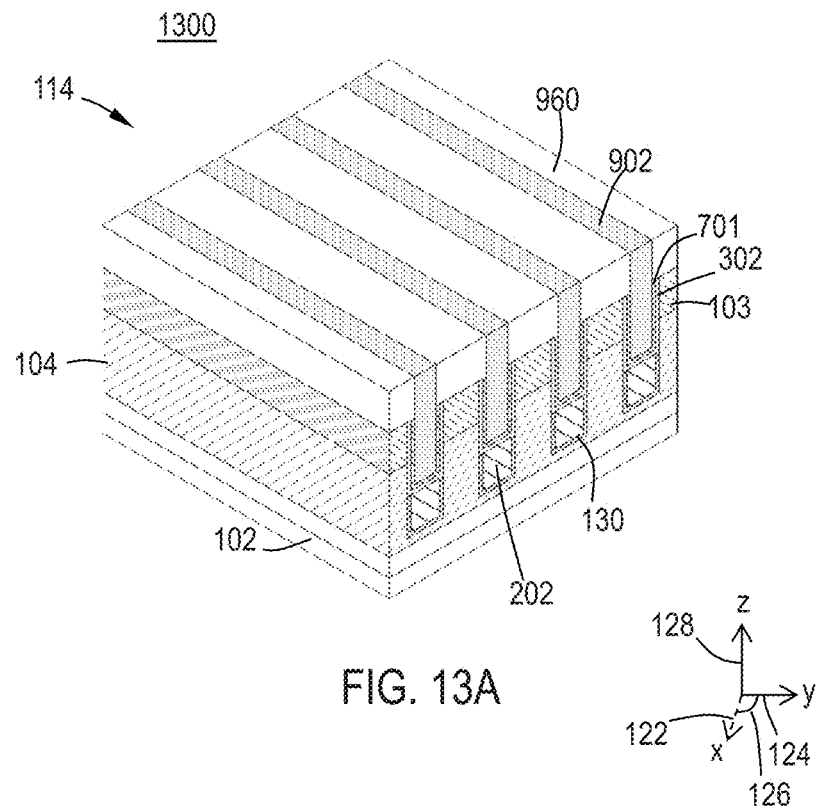
FIG. 13A illustrates a perspective view of an electronic device structure to provide a fully self-aligned via according to one or more embodiment.
Figure 13B:
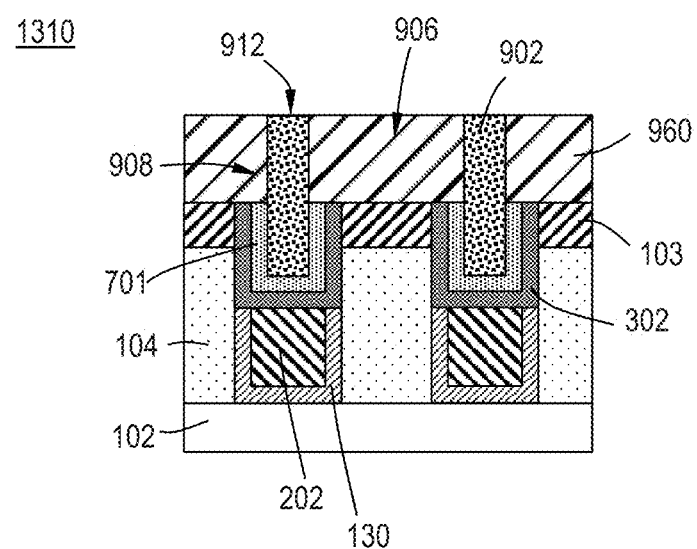
FIG. 13B illustrates a cross-sectional view of the electronic device structure of FIG. 13B.

FIG. 13A illustrates a perspective view 1300 of an electronic device 114 structure to provide a fully self-aligned via according to one or more embodiment. FIG. 13B illustrates a cross-sectional view 1310 of the electronic device structure of FIG. 13A. In one or more embodiments, a portion (i.e. overburden) of the insulating layer 960 is removed to expose the top surface 912 of the pillars 902 according to one or more embodiment. In one or more embodiments, the portion (i.e. overburden) of the insulating layer 960 is removed using a CMP technique known to one of ordinary skill in the art of microelectronic device manufacturing. In one or more embodiments, the portion (i.e. overburden) of the insulating layer 960 is etched back to expose the top surface 912 of the pillars 902 using one or more of the dry and wet etching techniques known to one of ordinary skill in the art of microelectronic device manufacturing.

In one or more embodiments, insulating layer 960 is deposited using one of deposition techniques, such as but not limited to a CVD, spin-on, an ALD, PVD, MBE, MOCVD, or other low-k insulating layer deposition techniques known to one of ordinary skill in the art of microelectronic device manufacturing. In another embodiment, insulating layer 960 is deposited to overfill the gaps 906 between the pillars 902, as described with respect to FIG. 10, and then a portion of the insulating layer 960 is etched back to expose upper portions of the sidewalls 908 and top surface 912 of the pillars 902 using one or more of the dry and wet etching techniques known to one of ordinary skill in the art of microelectronic device manufacturing.

FIG. 14A illustrates a perspective view 1400 of an electronic device 114 structure to provide a fully self-aligned via according to one or more embodiment. FIG. 14B illustrates a cross-sectional view 1410a of the electronic device structure of FIG. 14A. FIG. 14C illustrates a cross-sectional view 1410b of the electronic device structure of FIG. 14A according to an alternative embodiment. In one or more embodiments, the self-aligned selectively grown pillars 902 are selectively removed to form trenches 1002. In one or more embodiments, the pillars 902 are removed selectively to the insulating layer 960, the capping layer 103, and conformal second liner 302. Accordingly, in one or more embodiments, conformal third liner 701 is also removed. In another embodiment, when conformal second liner 302 is a non-conductive liner, the conformal second liner 302 is also removed. In one or more embodiments, the pillars 902, the conformal third liner 701, and conformal second liner 302 are removed selectively to the insulating layers 960 and 104, capping layer 103, and recessed conductive lines 202. In one or more embodiments, trenches 1002 are formed in the insulating layers 960 and 104 and capping layer 103. Trenches 1002 extend along the same axis as the recessed conductive lines 202. In one or more embodiments, each trench 1002 has a bottom that is a top surface 304 of conformal second liner 302. If there is no conformal second liner 302, the bottom of the trench 1002 would be the top surface of the recessed conductive lines 202. In another embodiment, conformal third liner 701 and conformal second liner 302 are removed so that each trench 1002 has a bottom that is a top surface of the recessed conductive lines 202 and opposing sidewalls that include portions of insulating layers 960 and 104 and capping layer 103. Generally, the aspect ratio of the trench refers to the ratio of the depth of the trench to the width of the trench. In one or more embodiments, the aspect ratio of each trench 1002 is in an approximate range from about 1:1 to about 200:1. In one or more embodiments, as illustrated in FIG. 14B, the taper angle of the trench 1002 is about 90°, and the trench 1002 is rectangular in all directions. In one or more embodiments, while the taper angle is about 90° C., the trench is rectangular in all directions, but has rounded corners due to subsequent processing.

In one or more embodiments, the tapering angle of the trench 1002 is in a range of from about 60° to about 120°, including about 65°, about 70°, about 75°, about 80°, about 85°, about 90°, about 95°, about 100°, about 105°, about 110°, or about 115°. In one or more embodiments, the tapering angle of the trench 1002 is in a range of from about 80° to about 85°. In one or more embodiments, the taper angle is controlled by etch process conditions, including, but not limited to bias, pressure, and flow.

In one or more embodiments, the pillars 902 are selectively removed using one or more of the dry and wet etching techniques known to one of ordinary skill in the art of electronic device manufacturing. In one or more embodiments, the pillars 902 are selectively wet etched by e.g., 5 wt. % of ammonium hydroxide ($NH_4OH$) aqueous solution at the temperature of about 80° C. In one or more embodiments, hydrogen peroxide ($H_2O_2$) is added to the 5 wt. % $NH_4OH$ aqueous solution to increase the etching rate of the pillars 902. In one or more embodiments, the pillars 902 are selectively wet etched using hydrofluoric acid (HF) and nitric acid ($HNO_3$) in a ratio of 1:1. In one or more embodiments, the pillars 902 are selectively wet etched using HF and $HNO_3$ in a ratio of 3:7 respectively. In one or more embodiments, the pillars 902 are selectively wet etched using HF and $HNO_3$ in a ratio of 4:1, respectively. In one or more embodiments, the pillars 902 are selectively wet etched using HF and $HNO_3$ in a ratio of 30%:70%, respectively. In one or more embodiments, the pillars 902 including tungsten (W), titanium (Ti), or both titanium and tungsten are selectively wet etched using $NH_4OH$ and $H_2O_2$ in a ratio of 1:2, respectively. In one or more embodiments, the pillars 902 are selectively wet etched using 305 grams of potassium ferricyanide ($K_3Fe(CN)_6$), 44.5 grams of sodium hydroxide (NaOH) and 1000 ml of water ($H_2O$). In one or more embodiments, the pillars 902 are selectively wet etched using diluted or concentrated one or more of the chemistries including hydrochloric acid (HCl), nitric acid ($HNO_3$), sulfuric acid ($H_2SO_4$), hydrogen fluoride (HF), and hydrogen peroxide ($H_2O_2$). In one or more embodiments, the pillars 90 are selectively etched using a solution of HF and $HNO_3$, a solution of $NH_4OH$ and $H_2O_2$, $WCl_5$, $WF_6$, niobium fluoride ($NbF_5$), chlorine with a hydrocarbon. In one or more embodiments, the hydrocarbon can be a monocarbon (e.g. $CH_4$) or a multicarbon-based hydrocarbon. In one or more embodiments, the pillars 902 are selectively wet etched using HF, $HNO_3$, and acetic acid ($CH_3COOH$) in a ratio of 4:4:3, respectively. In one or more embodiments, the pillars 902 are selectively dry etched using a bromotrifluoromethane ($CBrF_3$) reactive ion etching (RIE) technique. In one or more embodiments, the pillars 902 are selectively dry etched using chlorine-, fluorine-, bromine-, or any combination thereof, based chemistries. In one or more embodiments, the pillars 902 are selectively wet etched using hot or warm Aqua Regia mixture including HCl and $HNO_3$ in a ratio of 3:1, respectively. In one or more embodiments, the pillars 902 are selectively etched using alkali with oxidizers (potassium nitrate ($KNO_3$) and lead dioxide ($PbO_2$)). In one or more embodiments, the conformal third liner 701 and/or the conformal second liner 302 may be selectively removed using one or more of the dry and wet etching techniques known to one of ordinary skill in the art of electronic device manufacturing.

FIG. 14C shows a view 1410b of an embodiment in which at least one of the pillars 902 is removed and at least one of the pillars 902 remains. The skilled artisan will recognize that selective removal of some of the pillars can be effected by any suitable technique including, but not limited to, masking and lithography. While not illustrated further, the embodiment illustrated in FIG. 14C can be used in further processing as described below.

Figure 14D:
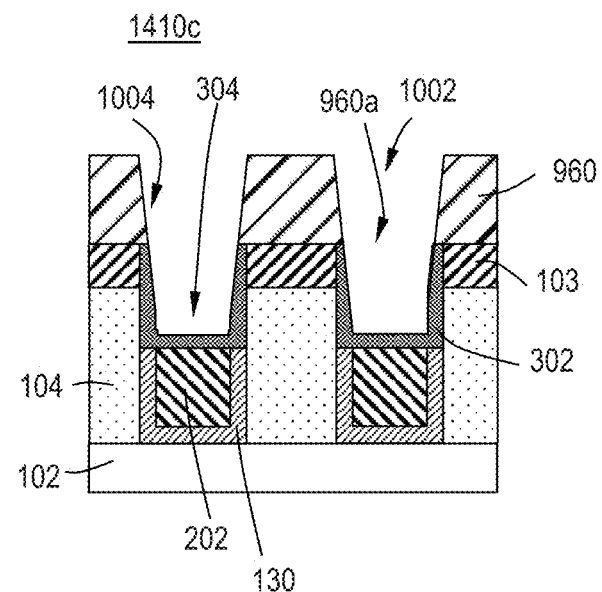
FIG. 14D illustrates a cross-section view of the electronic device of FIG. 14A according to an alternative embodiment.
Figures 14E, 14F:
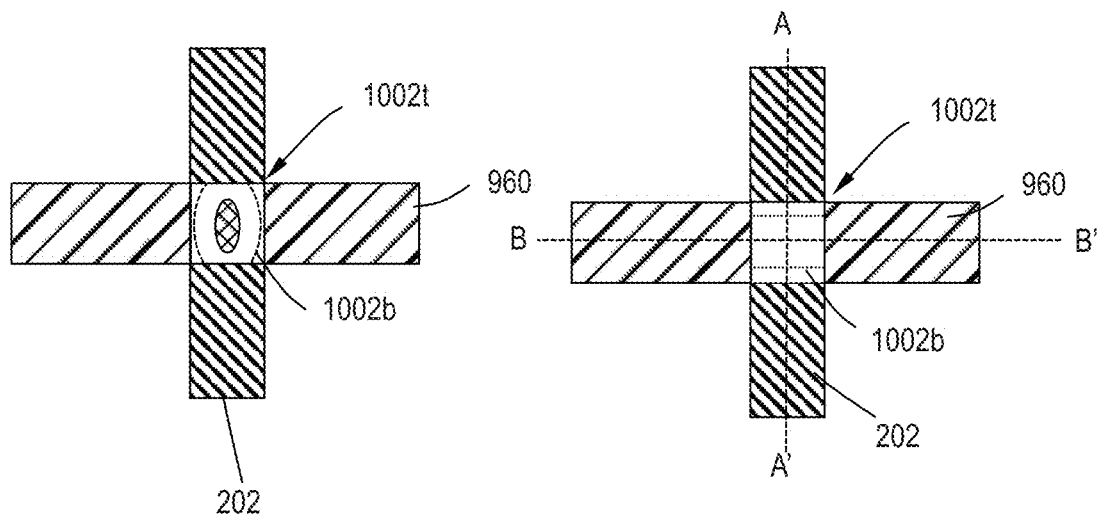
FIG. 14E illustrates a top view of the electronic device of FIG. 14D according to one or more embodiments.
FIG. 14F illustrates a top view of the electronic device of FIG. 14D according to one or more embodiments.

FIG. 14D shows a view 1410c of an embodiment wherein at least one of the pillars 902 is selectively removed using one or more of the dry and wet etching techniques known to one of ordinary skill in the art of electronic device manufacturing. With reference to FIGS. 14D and 14E, the trench 1002 is oval shaped and tapered on all four sides 1003. FIG. 14E illustrates the oval shaped top of the trench 1002t and the oval shaped bottom of the trench 1002b. FIG. 14F shows a view 1410c of an embodiment wherein the trench 1002 is tapered on two sides. The trench is tapered in the A-A' direction and rectangular in the B-B' direction.

It is noted that in FIGS. 14A-27, there is an overhang 960a of insulating layer 960. In one or more embodiments, the overhang 960a has a thickness in a range of from about 0 Å to about 60 Å. Accordingly, in some embodiments, the over 960a of insulating layer 960 is not present (not illustrated). In one or more embodiments, the thickness of the overhang 960a is determined by the thickness of the liner 302. In one or more embodiments, the line 302 has a thickness of about 0 Å to about 100 Å, or about 0 Å to about 50 Å. In other embodiments, the overhang 960a thickness is determined by the removal of the pillar 902. In some embodiments, when the pillar 902 is removed, as described above, the insulating layer 960 can be etched such that there is a large overhang 960a, while in other embodiments, the pillar 902 is removed and the insulating layer 960 is etched such that there is little to no overhang 960a.

Figure 15A:
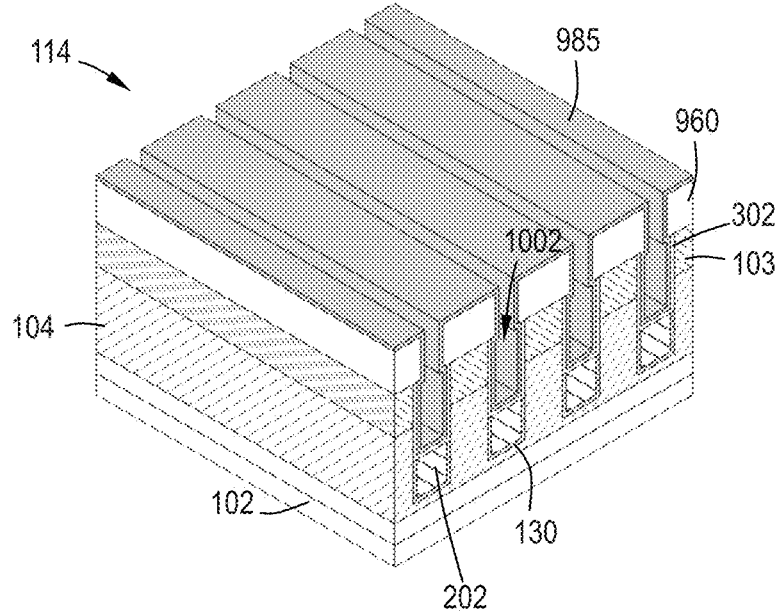
FIG. 15A illustrates a perspective view of an electronic device structure to provide a fully self-aligned via according to one or more embodiment.
Figure 15B:
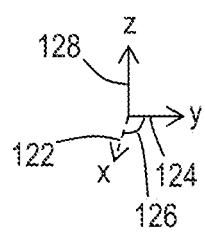
FIG. 15B illustrates a cross-sectional view of the electronic device structure of FIG. 15B.
Figure 15B:
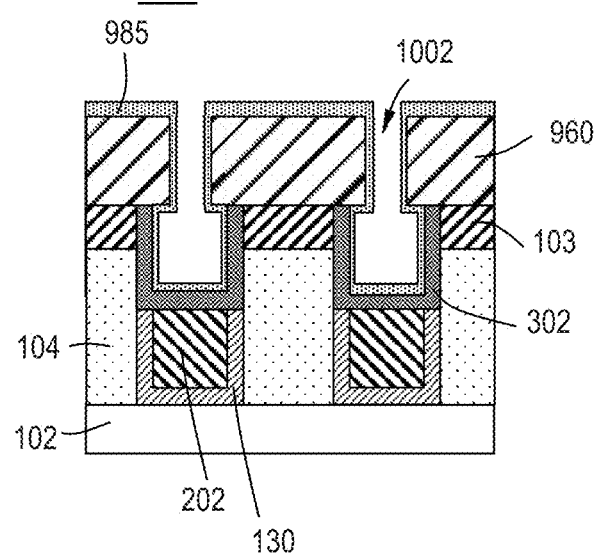

FIG. 15A illustrates a perspective view 1500 of an electronic device 114 structure to provide a fully self-aligned via according to one or more embodiment. FIG. 15B illustrates a cross-sectional view 1510 of the electronic device structure of FIG. 15A. As illustrated, in one or more embodiments, an etch stop layer 985 is deposited in the trenches 1002 on the insulating layer 960 and on the conformal second liner 302. The etch stop layer 985 can comprise any suitable material known to the skilled artisan. In one or more embodiments, the etch stop layer 985 comprises aluminum oxide ($AlO_x$).

Figure 16A:
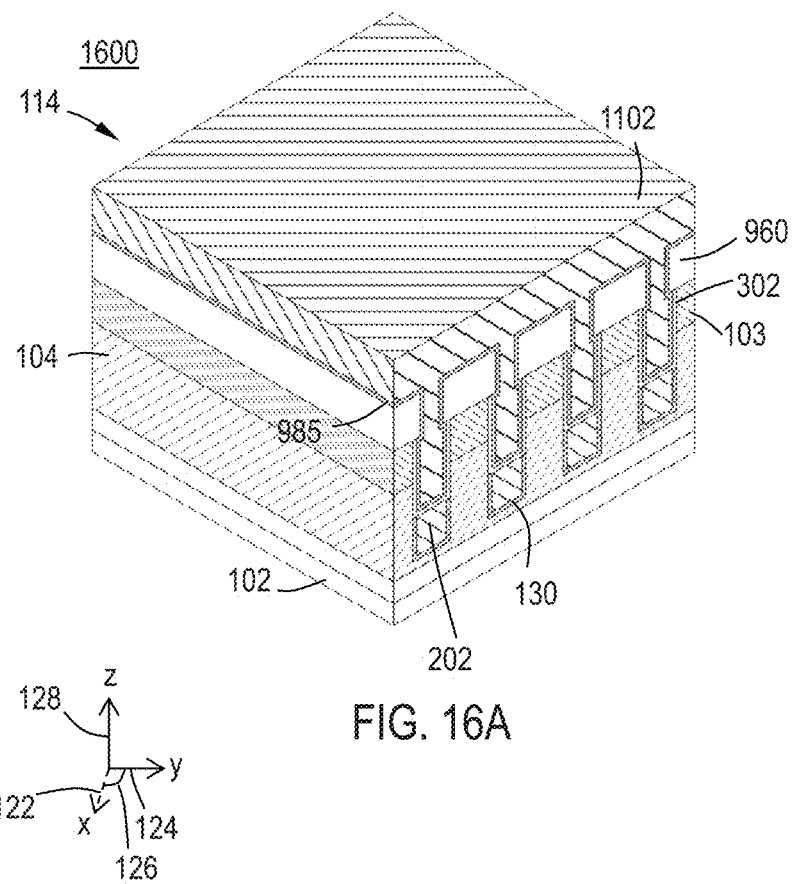
FIG. 16A illustrates a perspective view of an electronic device structure to provide a fully self-aligned via according to one or more embodiment.
Figure 16B:
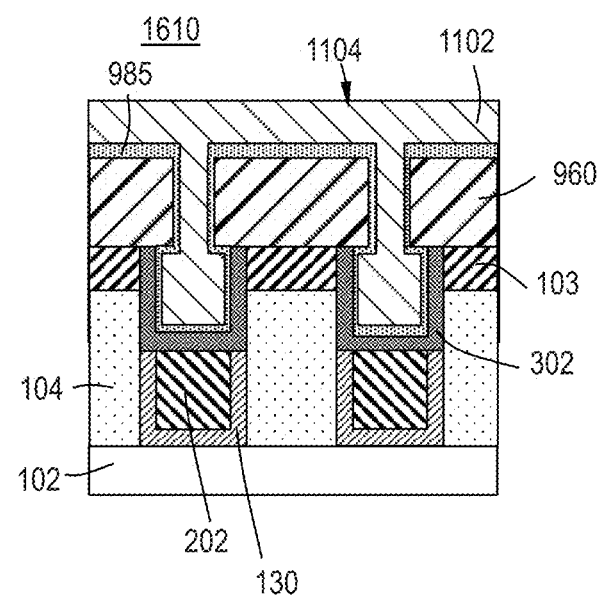
FIG. 16B illustrates a cross-sectional view of the electronic device structure of FIG. 16B.

FIG. 16A illustrates a perspective view 1600 of an electronic device 114 structure to provide a fully self-aligned via according to one or more embodiment. FIG. 16B illustrates a cross-sectional view 1610 of the electronic device structure of FIG. 16A. In one or more embodiments, an insulating layer 1102 is deposited into trenches 1002 to form filled vias according to one or more embodiment. In one or more embodiments, insulating layer 1102 overfills the trenches 1002 so that portions of the insulating layer 1102 are deposited on the top portions of the insulating layer 960. In one or more embodiments, the thickness of the insulating layer 1102 is sufficient so that the top surface 1104 of the insulating layer 1102 is above or of similar height to the insulating layer 960. In another embodiment, portions (i.e. overburden) of the insulating layer 1102 are removed using one or more of CMP or a back etch technique to even out with the top portions of the insulating layer 960, and then another insulating layer (not shown) is deposited onto the top portions of the insulating layer 960 and insulating layer 1102. In one or more embodiments, insulating layer 1102 is deposited on the sidewalls and bottom of the trenches 1002. In one or more embodiments, the insulating layer 1102 is deposited on the conformal second liner 302 and portions of the insulating layer 960. In another embodiment, when the conformal second liner 302 is removed, the insulating layer 1102 is directly deposited on the recessed conductive lines 202, portions of the capping layer 103, and portions of the insulating layer 104 and insulating layer 960. In one or more embodiments, the insulating layer 1102 is etch selective to the insulating layer 960. Generally, etch selectivity between two materials is defined as the ratio between their etching rates at similar etching conditions. In one or more embodiments, the ratio of the etching rate of the insulating layer 1102 to that of the insulating layer 960 is at least 5:1, 10:1, 15:1, 20:1 or 25:1. In one or more embodiments, the ratio of the etching rates of the insulating layer 1102 to that of the insulating layer 960 is in an approximate range from about 2:1 to about 50:1, or in the range of from about 3:1 to about 30:1, or in the range of from about 4:1 to about 20:1.

In one or more embodiments, insulating layer 1102 is a low-κ gapfill layer. In one or more embodiments, insulating layer 1102 is a flowable silicon oxide carbide (FSiOC) layer. In some other embodiments, insulating layer 1102 is an oxide layer, e.g., silicon dioxide, or any other electrically insulating layer determined by an electronic device design. In one or more embodiments, insulating layer 1102 is an interlayer dielectric (ILD). In one or more embodiments, insulating layer 1102 is a low-κ dielectric that includes, but is not limited to, materials such as, e.g., silicon dioxide, silicon oxide, a carbon based material, e.g., a porous carbon film carbon doped oxide ("CDO"), e.g., carbon doped silicon dioxide, porous silicon dioxide, porous silicon oxide carbide hydride (SiOCH), silicon nitride, or any combination thereof. In one or more embodiments, insulating layer 1102 is a dielectric material having κ-value less than 3. In more specific embodiment, insulating layer 1102 is a dielectric material having κ-value in an approximate range from about 2.2 to about 2.7. In one or more embodiments, insulating layer 1102 includes a dielectric material having κ-value less than 2. In one or more embodiments, insulating layer 1102 represents one of the insulating layers described above with respect to insulating layer 104 and insulating layer 960.

In one or more embodiments, insulating layer 1102 is a low-κ interlayer dielectric to isolate one metal line from other metal lines. In one or more embodiments, insulating layer 1102 is deposited using one of deposition techniques, such as but not limited to a CVD, spin-on, an ALD, PVD, MBE, MOCVD, or other low-k insulating layer deposition techniques known to one of ordinary skill in the art of microelectronic device manufacturing.

Figure 17A:
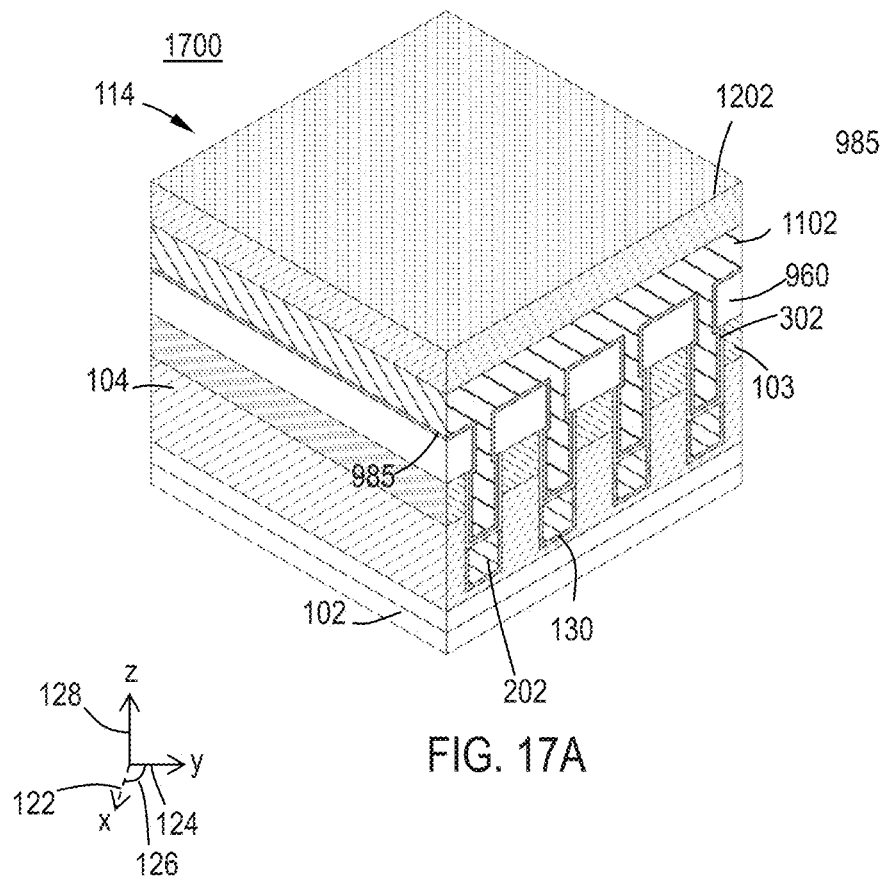
FIG. 17A illustrates a perspective view of an electronic device structure to provide a fully self-aligned via according to one or more embodiment.
Figure 17B:
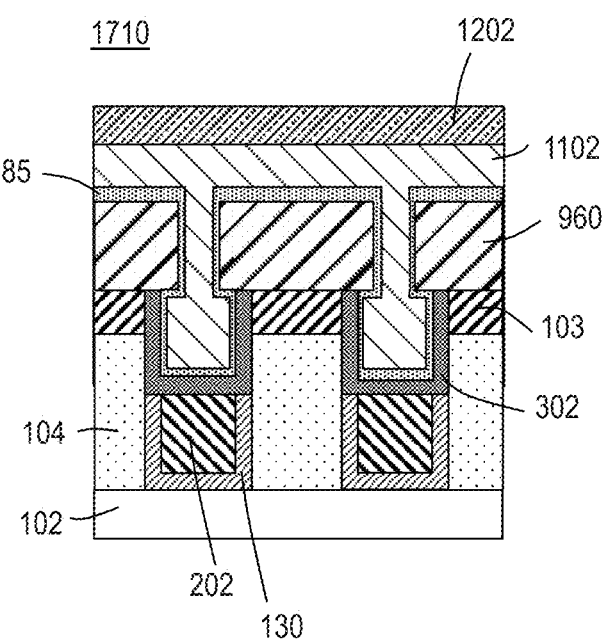
FIG. 17B illustrates a cross-sectional view of the electronic device structure of FIG. 17B.
Figure 18:
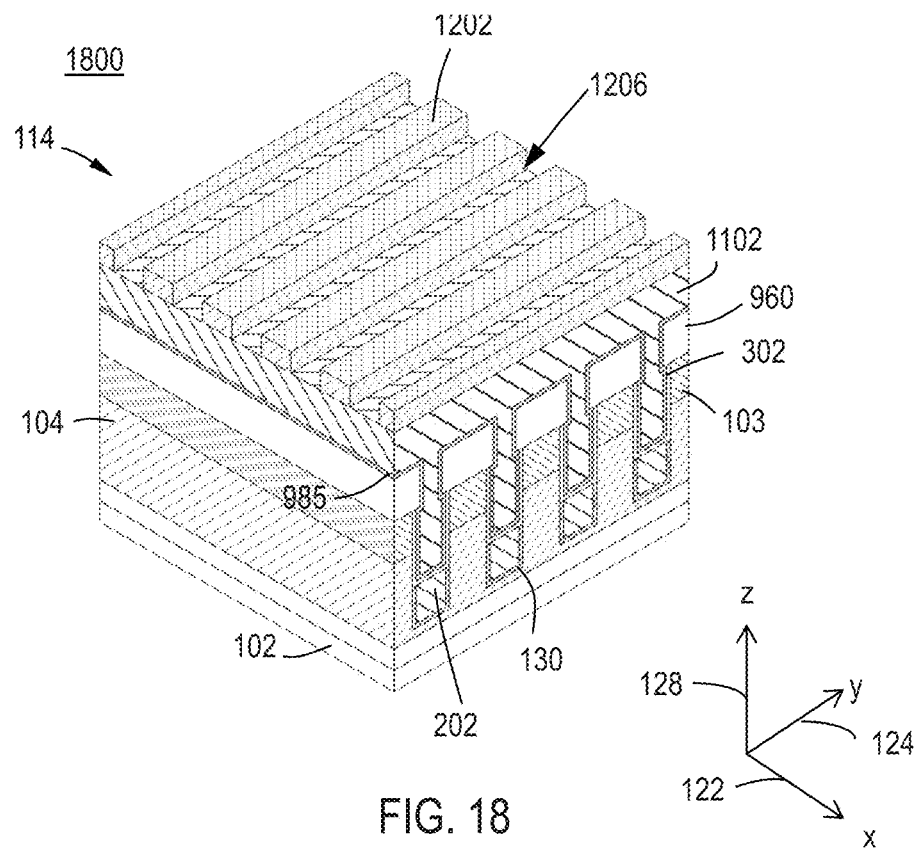
FIG. 18 illustrates a perspective view of an electronic device structure to provide a fully self-aligned via according to one or more embodiment.

FIG. 17A illustrates a perspective view 1700 of an electronic device 114 structure to provide a fully self-aligned via according to one or more embodiment. FIG. 17B illustrates a cross-sectional view 1710 of the electronic device structure of FIG. 17A. In one or more embodiments, a hard mask layer 1202 is deposited on insulating layer 1102 according to one or more embodiment. In one or more embodiments, hard mask layer 1202 is a metallization layer hard mask. As illustrated in FIG. 18, which is a perspective view 1800 of an electronic device 114, in one or more embodiments, the hard mask layer 1202 is patterned to define a plurality of trenches 1206. In one or more embodiments, the trenches 1206 extend along a Y axis (direction) 124 that crosses an X axis (direction) 122 at an angle. In one or more embodiments, Y axis 124 is substantially perpendicular to Y axis 124. In one or more embodiments, patterned hard mask layer 1202 is a carbon hard mask layer, a metal oxide hard mask layer, a metal nitride hard mask layer, a silicon nitride hard mask layer, a silicon oxide hard mask layer, a carbide hard mask layer, or other hard mask layer known to one of ordinary skill in the art of microelectronic device manufacturing. In one or more embodiments, the patterned hard mask layer 1202 is formed using one or more hard mask patterning techniques known to one of ordinary skill in the art of microelectronic device manufacturing. In one or more embodiments, the insulating layer 1102 is etched through a patterned hard mask layer to form trenches 1206 using one or more of etching techniques known to one of ordinary skill in the art of microelectronic device manufacturing. In one or more embodiments, the size of trenches in the insulating layer 1102 is determined by the size of conductive lines formed later on in a process.

Figure 19:
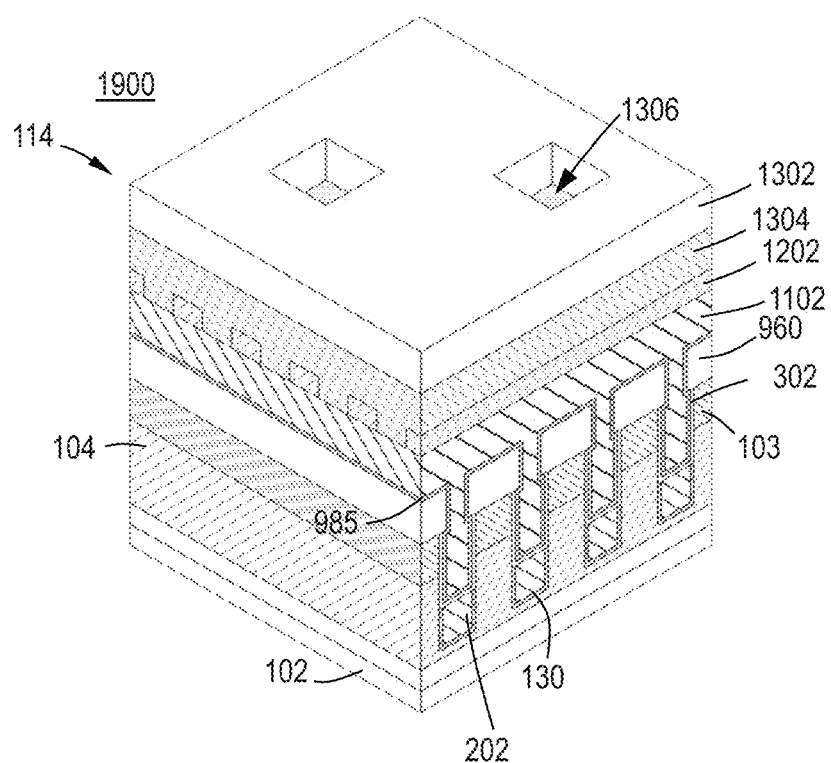
FIG. 19 illustrates a perspective view of an electronic device structure to provide a fully self-aligned via according to one or more embodiment.

FIG. 19 illustrates a perspective view 1900 of an electronic device 114 structure to provide a fully self-aligned via according to one or more embodiment. In one or more embodiments, a mask layer 1302 is deposited on an insulating layer 1304 on a patterned hard mask layer 1202 according to one or more embodiment. As illustrated in FIG. 19, an opening 1306 is formed in hard mask layer 1202. In one or more embodiments, opening 1306 is formed above one of the recessed conductive lines 202. In one or more embodiments, the opening 1306 defines a trench portion of the fully self-aligned via formed later on in a process.

In one or more embodiments, mask layer 1302 includes a photoresist layer. In one or more embodiments, mask layer 1302 includes one or more hard mask layers. In one or more embodiments, the insulating layer 1304 is a hard mask layer. In one or more embodiments, insulating layer 1304 includes a bottom anti-reflective coating (BARC) layer. In one or more embodiments, insulating layer 1304 includes a titanium nitride (TiN) layer, a tungsten carbide (WC) layer, a tungsten bromide carbide (WBC) layer, a carbon hard mask layer, a metal oxide hard mask layer, a metal nitride hard mask layer, a silicon nitride hard mask layer, a silicon oxide hard mask layer, a carbide hard mask layer, other hard mask layer, or any combination thereof. In one or more embodiments, insulating layer 1304 represents one of the insulating layers described above. In one or more embodiments, mask layer 1302 is deposited using one or more mask layer deposition techniques known to one of ordinary skill in the art of microelectronic device manufacturing. In one or more embodiments, insulating layer 1304 is deposited using one of deposition techniques, such as but not limited to a CVD, PVD, MBE, NOCVD, spin-on, or other insulating layer deposition techniques known to one of ordinary skill in the art of microelectronic device manufacturing. In one or more embodiments, the opening 1306 is formed using one or more of the patterning and etching techniques known to one of ordinary skill in the art of microelectronic device manufacturing.

Figure 20:
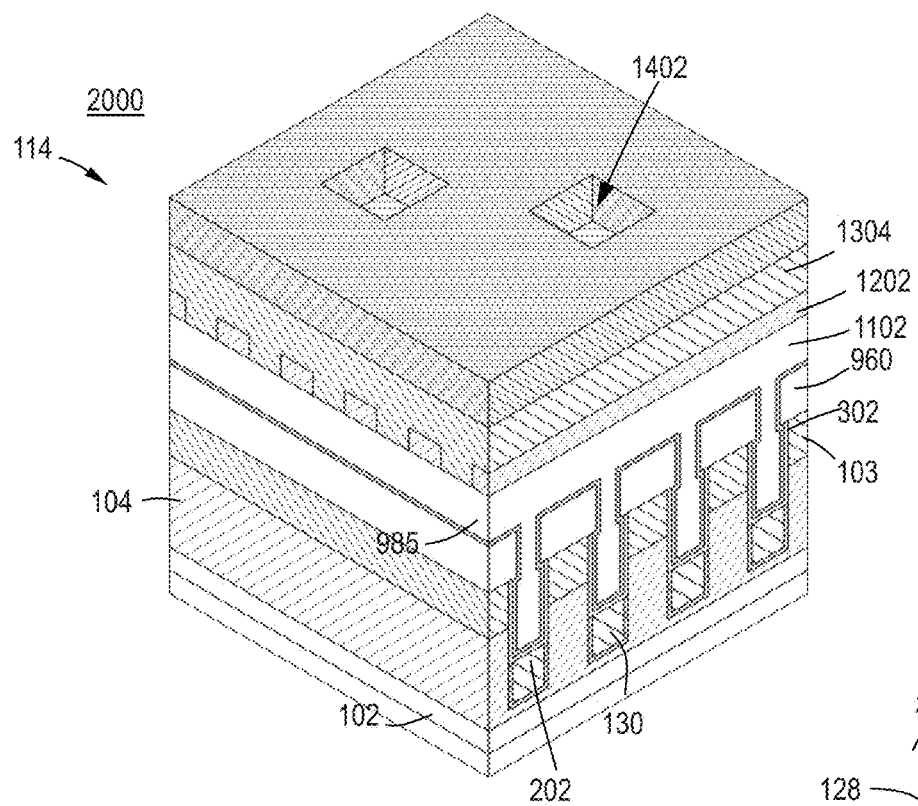
FIG. 20 illustrates a perspective view of an electronic device structure to provide a fully self-aligned via according to one or more embodiment.

FIG. 20 illustrates a perspective view 2000 of an electronic device 114 structure to provide a fully self-aligned via according to one or more embodiment. In one or more embodiments, the insulating layer 1304 and insulating layer 1102 are selectively etched through opening 1306 to form an opening 1402 according to one or more embodiments.

Figure 21:
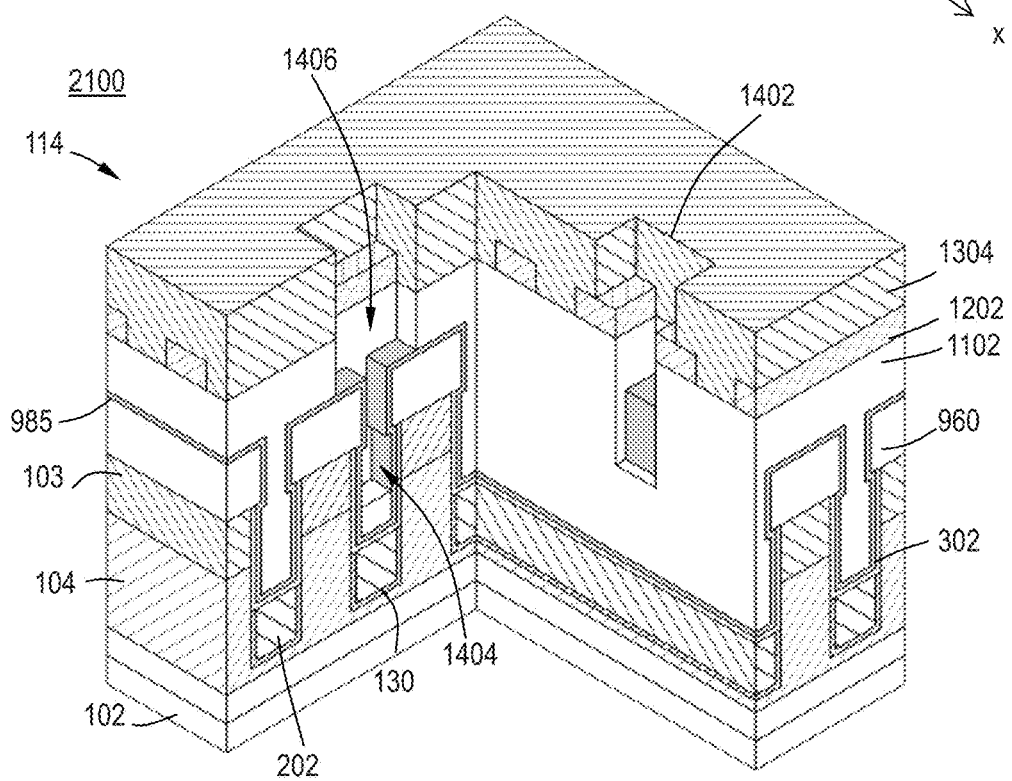
FIG. 21 illustrates a perspective view of an electronic device structure to provide a fully self-aligned via according to one or more embodiment.

FIG. 21 illustrates a perspective view 2100 of an electronic device 114 structure to provide a fully self-aligned via according to one or more embodiment. FIG. 21 is different from FIG. 20 in that FIG. 21 shows a cut through opening 1402 along X axis 122 and Y axis 124. As shown in FIG. 21, opening 1402 includes a via portion 1404 and a trench portion 1406. As shown in FIG. 21, via portion 1404 of the opening 1402 is limited along Y axis 124 by insulating layer 104. Via portion 1404 of the opening 1402 is self-aligned along Y axis 124 to one of the recessed conductive lines 202. As shown in FIG. 21, trench portion 1406 is limited along X axis 122 by the features of the hard mask layer 1202 that extend along Y axis 124. In one or more embodiments, insulating layer 1102 is selectively etched relative to the insulating layer 960 to form opening 1402.

Figure 22:
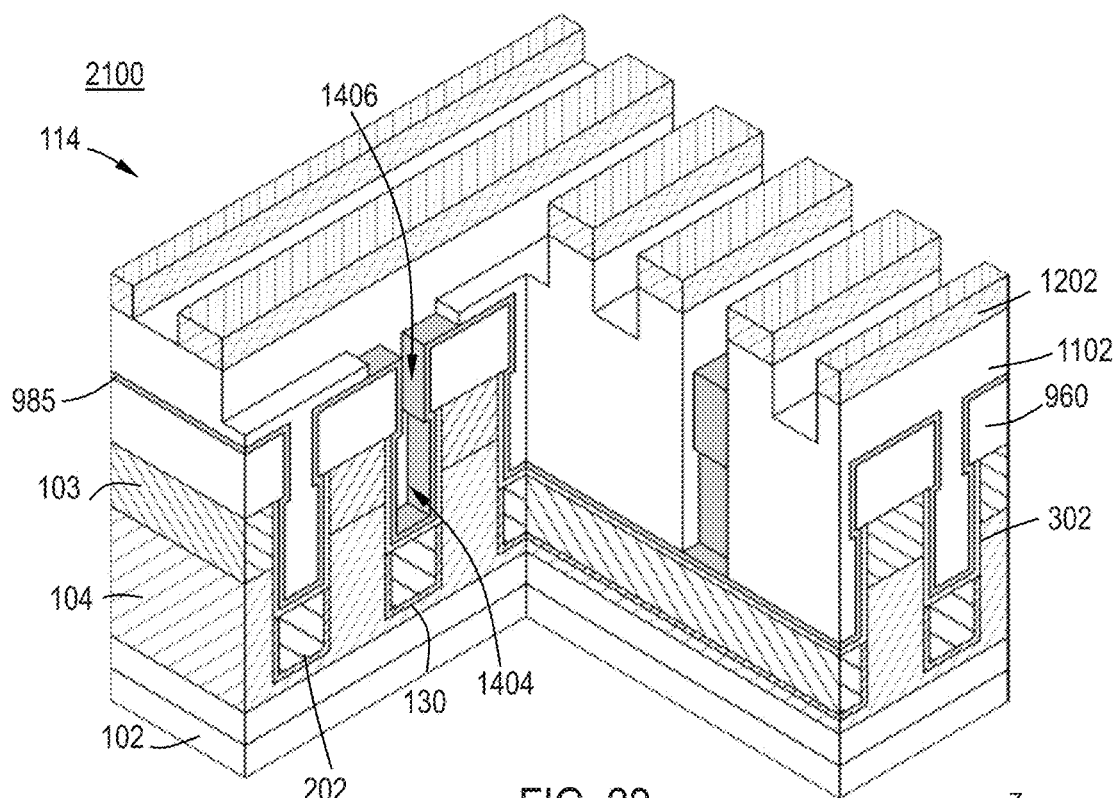
FIG. 22 illustrates a perspective view of an electronic device structure to provide a fully self-aligned via according to one or more embodiment.

In one or more embodiments, insulating layer 1102 is selectively etched relative to the insulating layer 960 to form opening 1402. As shown in FIG. 22, mask layer 1302 and insulating layer 1304 are removed. In one or more embodiments, mask layer 1302 is removed using one or more of the mask layer removal techniques known to one of ordinary skill in the art of microelectronic device manufacturing. In one or more embodiments, insulating layer 1304 is removed using one or more of the etching techniques known to one of ordinary skill in the art of microelectronic device manufacturing.

Figure 23:
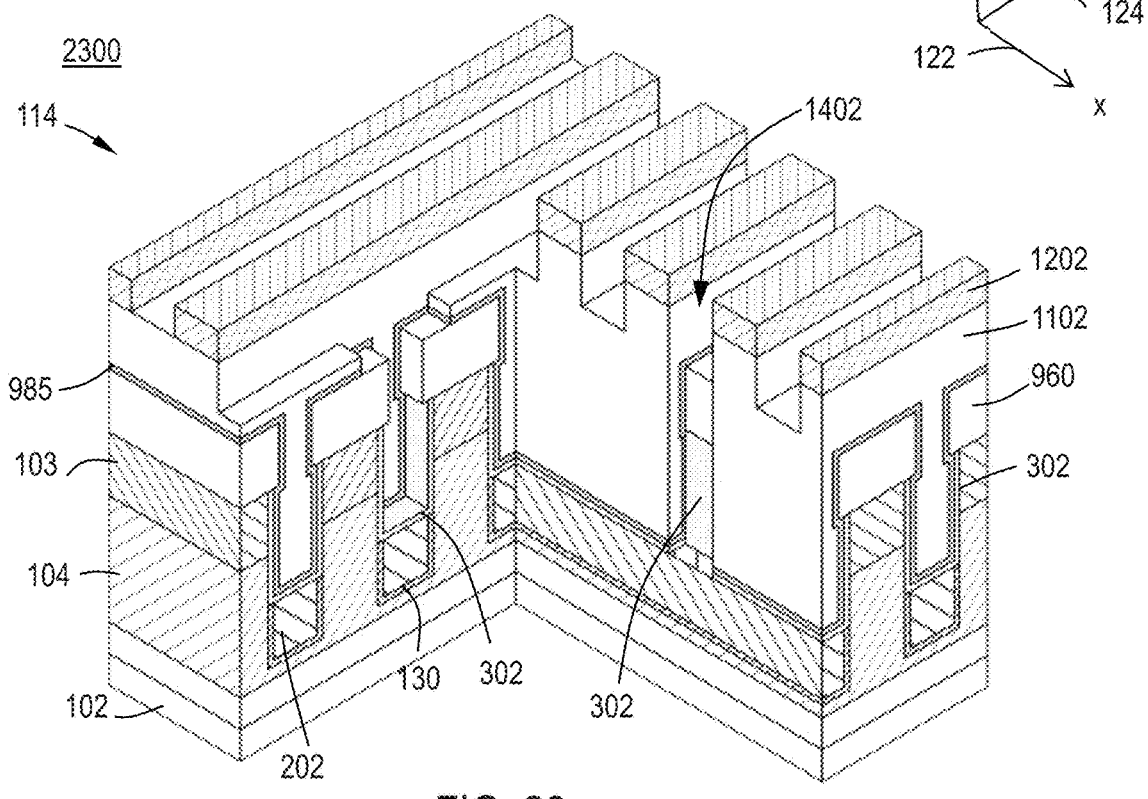
FIG. 23 illustrates a perspective view of an electronic device structure to provide a fully self-aligned via according to one or more embodiment.

FIG. 23 illustrates a perspective view 2300 of an electronic device 114 structure to provide a fully self-aligned via according to one or more embodiment after removal of etch stop layer 985 to expose the underlying conformal liner 302. In some embodiments, the etch stop layer 985 remains and is present in the final device.

Figure 24A:
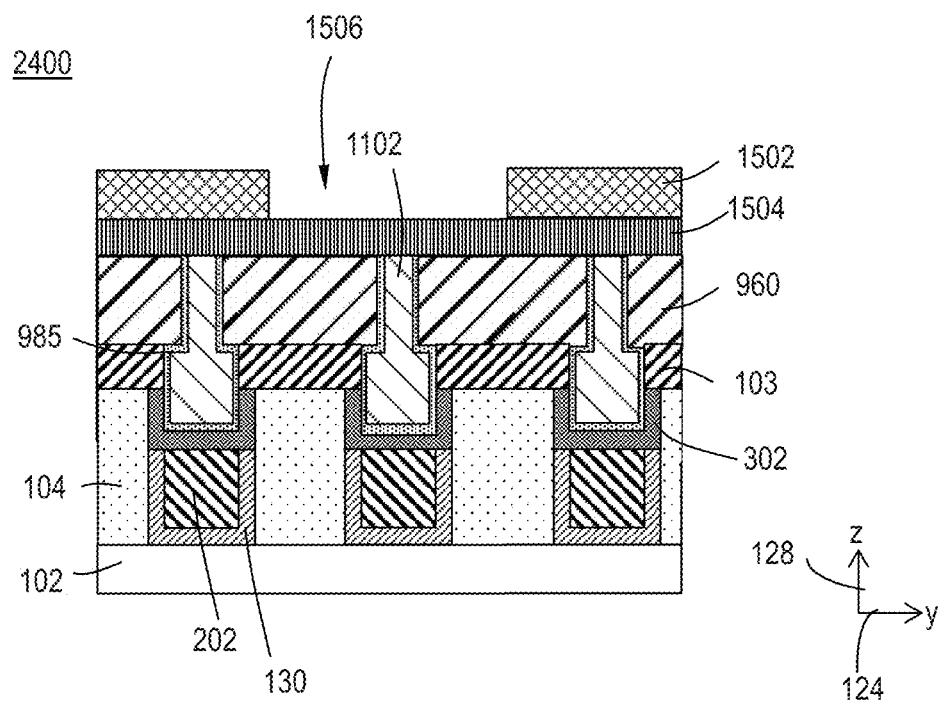
FIG. 24A illustrates a cross-sectional view of an electronic device structure to provide a fully self-aligned via according to one or more embodiment.
Figure 24B:
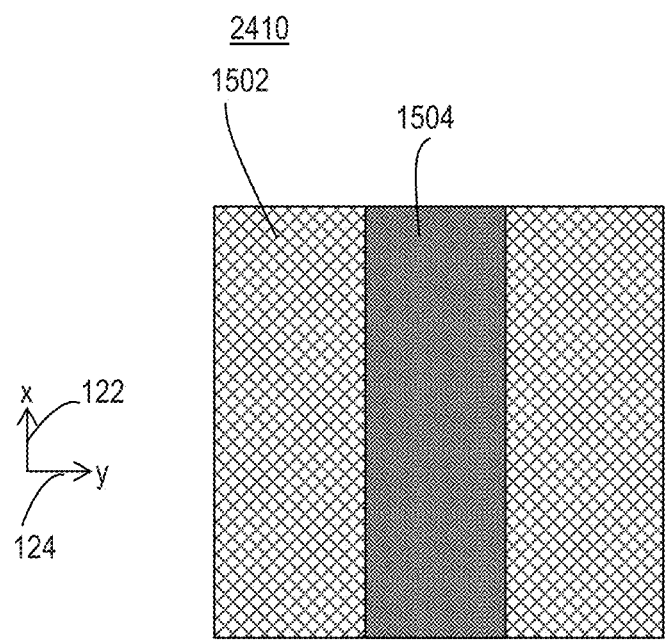
FIG. 24B illustrates a top view of the electronic device of FIG. 24A.

FIG. 24A illustrates a perspective view 2400 of an electronic device 114 structure to provide a fully self-aligned via according to one or more embodiment. FIG. 24A is a view 2400 similar to FIG. 16B, after a mask layer 1502 is deposited on a hard mask layer 1504 on the exposed insulating layer 960 and insulating layer 1102 according to one or more embodiment. FIG. 24B is a top view 2410 of the electronic device structure depicted in FIG. 24A. As shown in FIG. 24A, a portion of the insulating layer 1102 is removed to even out top portions of the insulating layer 960 with top portions of the insulating layer 1102. As shown in FIGS. 24A and 24B, mask layer 1502 has an opening 1506 to expose hard mask layer 1502.

In one or more embodiments, the portion of the insulating layer 1102 is removed using a CMP technique known to one of ordinary skill in the art of microelectronic device manufacturing. In one or more embodiments, a portion of the insulating layer 1102 is etched back to expose the top portion of the insulating layer 960. In another embodiment, a portion of the insulating layer 960 is etched back to a predetermined depth to expose upper portions of the sidewalls and top portions of the insulating layer 1102 in the trenches 1002. In one or more embodiments, the portion of the insulating layer 960 is etched back using one or more of the dry and wet etching techniques known to one of ordinary skill in the art of microelectronic device manufacturing.

In one or more embodiments, mask layer 1502 includes a photoresist layer. In one or more embodiments, mask layer 1502 includes one or more hard mask layers. In one or more embodiments, mask layer 1502 is a tri-layer mask stack, e.g., a 193 nm immersion (193i) or EUV resist mask on a middle layer (ML) (e.g., a silicon containing organic layer or a metal containing dielectric layer) on a bottom anti-reflective coating (BARC) layer on a silicon oxide hard mask. In one or more embodiments, the hard mask layer 1504 is a metallization layer hard mask to pattern the conductive lines of the next metallization layer. In one or more embodiments, hard mask layer 1504 includes a titanium nitride (TiN) layer, a tungsten carbide (WC) layer, a tungsten bromide carbide (WBC) layer, a carbon hard mask layer, a metal oxide hard mask layer, a metal nitride hard mask layer, a silicon nitride hard mask layer, a silicon oxide hard mask layer, a carbide hard mask layer, other hard mask layer or any combination thereof. In one or more embodiments, hard mask layer 1504 represents one of the hard mask layers described above.

In one or more embodiments, the insulating layer 960 and the insulating layer 1102 are patterned and etched using hard mask layer 1504 to form trenches using one or more patterning and etching techniques known to one or ordinary skill in the art of microelectronic device manufacturing. In one or more embodiments, the size of trenches in the insulating layer 960 and insulating layer 1102 is determined by the size of conductive lines formed later on in a process.

In one or more embodiments, the mask layer 1502 is deposited using one or more of the mask deposition techniques known to one of ordinary skill in the art of microelectronic device manufacturing. In one or more embodiments, hard mask layer 1504 is deposited using one or more hard mask layer deposition techniques, such as but not limited to a CVD, PVD, MBE, MOCVD, spin-on, or other hard mask deposition known to one of ordinary skill in the art of microelectronic device manufacturing. In one or more embodiments, the opening 1506 is formed using one or more of the patterning and etching techniques known to one of ordinary skill in the art of microelectronic device manufacturing.

Figure 25A:
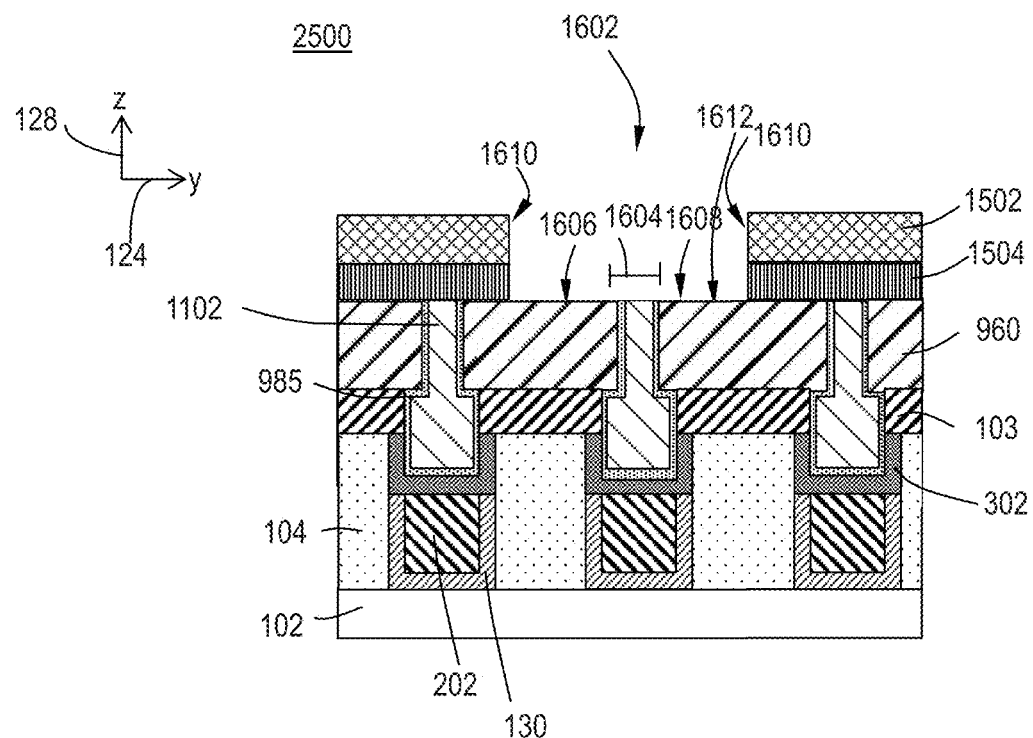
FIG. 25A illustrates a cross-sectional view of an electronic device structure to provide a fully self-aligned via according to one or more embodiment.
Figure 25B:
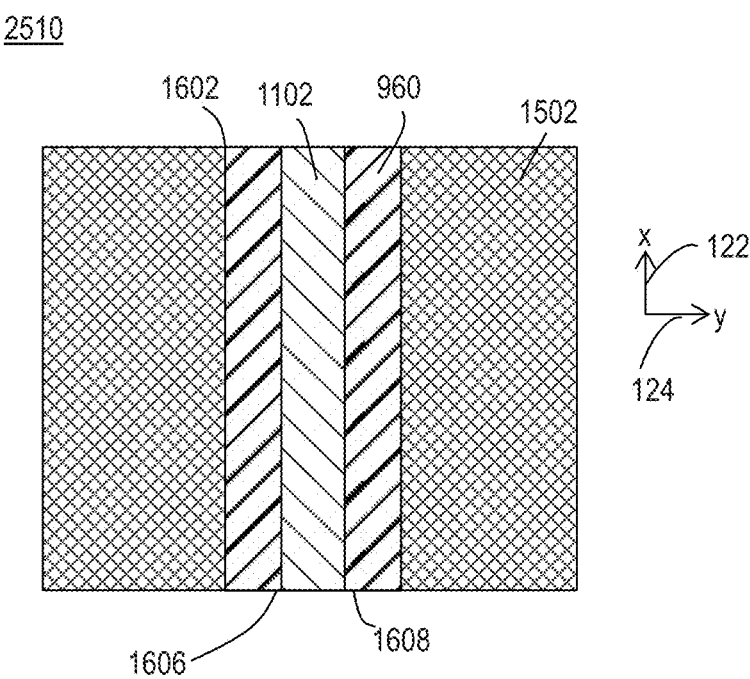
FIG. 25B illustrates a top view of the electronic device of FIG. 25A.

FIG. 25A is a view 2500 similar to FIG. 24A, after portions of the hard mask layer 1504, insulating layer 960 and insulating layer 1102 are removed through opening 1506 to form an opening 1602 in insulating layer 960 according to one or more embodiment. FIG. 25B is a top view 2510 of the electronic device structure depicted in FIG. 25A. In one or more embodiments, opening 1602 is a trench opening for a via. As shown in FIGS. 25A and 25B, opening 1602 includes a bottom 1612 that includes a portion 1604 of the insulating layer 1102 between portions 1606 and 1608 of the insulating layer 960. As shown in FIGS. 25A and 25B, opening 1602 includes opposing sidewalls 1610 that include portions of the insulating layer 960. In one or more embodiments, each sidewall 1610 is substantially orthogonal to bottom 1612. In another embodiment, each sidewall 1610 is slanted relative to bottom 1612 at an angle other than 90 degrees, so that an upper portion of the opening 1602 is greater than a lower portion of the opening 1602.

In one or more embodiments, opening 1602 having slanted sidewalls is formed using an angled non-selective etch. In one or more embodiments, hard mask layer 1504 is removed using one or more of wet etching, dry etching, or a combination thereof techniques known to one of ordinary skill in the art of microelectronic device manufacturing. In one or more embodiments, insulating layer 960 and insulating layer 1102 are removed using a non-selective etch in a trench first dual damascene process. In one or more embodiments, insulating layer 960 and insulating layer 1102 are etched down to the depth that is determined by time. In another embodiment, insulating layer 960 and insulating layer 1102 are etched non-selectively down to an etch stop layer (not shown). In one or more embodiments, insulating layer 960 and insulating layer 1102 are non-selectively etched using one or more of wet etching, dry etching, or a combination thereof techniques known to one of ordinary skill in the art of electronic device manufacturing.

Figure 26A:
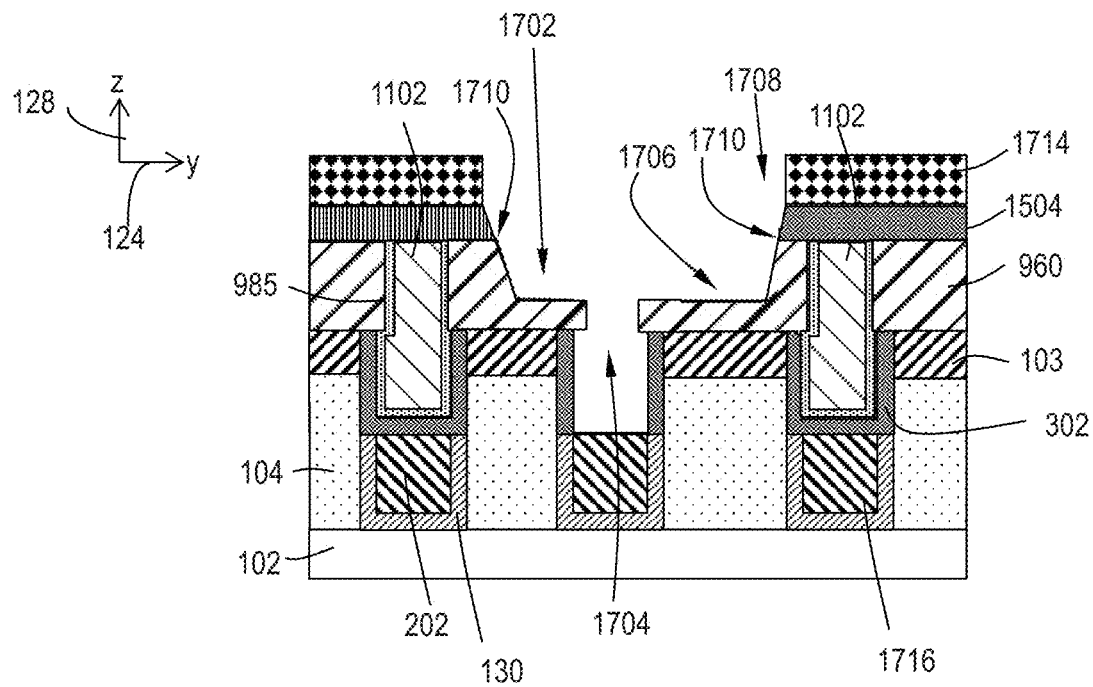
FIG. 26A illustrates a cross-sectional view of an electronic device structure to provide a fully self-aligned via according to one or more embodiment.
Figure 26B:
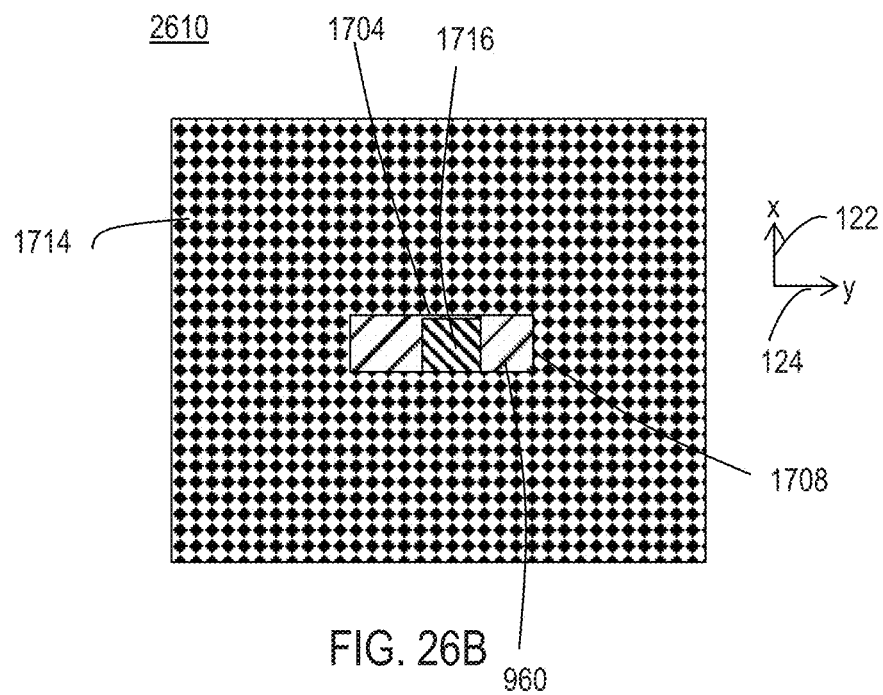
FIG. 26B illustrates a top view of the electronic device of FIG. 26A.

FIG. 26A is a view 2600 similar to FIG. 25A, after a fully self-aligned opening 1702 is formed in insulating layer 960 according to one or more embodiment. FIG. 26B is a top view 2610 of the electronic device structure depicted in FIG. 26A. As shown in FIGS. 26A and 26B, mask layer 1502 is removed. Mask layer 1502 can be removed using one of the mask layer removal techniques known to one of ordinary skill in the art of microelectronic device manufacturing. A patterned mask layer 1714 is formed on hard mask layer 1504. As shown in FIG. 26B, patterned mask layer 1714 is deposited on the hard mask layer 1504 and into opening 1602. Patterned mask layer 1714 has a mask opening 1708. Patterned mask layer 1714 can be formed using one or more of the mask layer depositing, patterning and etching techniques known to one of ordinary skill in the art of microelectronic device manufacturing.

Fully self-aligned opening 1702 is formed through mask opening 1708. Fully self-aligned opening 1702 includes a trench opening 1706 and a via opening 1704, as shown in FIGS. 26A and 26B. Via opening 1704 is underneath trench opening 1706. In one or more embodiments, trench opening 1706 is the part that is exposed through mask opening 1708.

In one or more embodiments, via opening 1704 is formed by selectively etching insulating layer 1102 relative to the insulating layer 960 through mask opening 1708 and trench opening 1706. In one or more embodiments, trench opening 1706 extends along Y axis 124. As shown in FIG. 20B, trench opening 1706 is greater along Y axis 124 than along X axis 122.

In one or more embodiments, trench opening 1706 of the opening 1702 is self-aligned along X axis 122 between the features of the hard mask layer 1504 that are used to pattern the upper metallization layer conductive lines that extend along Y axis 124 (not shown). The via opening 1704 of the opening 1702 is self-aligned along Y axis 124 by the insulating layer 802 that is left intact by selectively etching the portion 1604 of the insulating layer 1102 relative to the insulating layer 960. This provides an advantage as the size of the trench opening 1706 does not need to be limited to the size of the cross-section between the conductive line 1716 and one of the conductive lines of the upper metallization layer that provides more flexibility for the lithography equipment. As the portion 1604 is selectively removed relative to the insulating layer 960, the size of the trench opening increases.

As shown in FIGS. 25A and 25B, the portion 1604 is self-aligned with a conductive line 1716 that is one of the lower metallization layer recessed conductive lines 202. That is, the opening 1702 is self-aligned along both X and Y axes.

FIG. 26A is different from FIG. 25A in that FIG. 25A illustrates trench opening 1706 having slanted sidewalls 1710. Each sidewall 1710 is at an angle other than 90 degrees to the top surface of the substrate 102, so that an upper portion of the trench opening 1706 is greater than a lower portion of the trench opening 1706. In another embodiment, the sidewalls 1710 are substantially orthogonal to the top surface of the substrate 102.

In one or more embodiments, mask layer 1714 includes a photoresist layer. In one or more embodiments, mask layer 1714 includes one or more hard mask layers. In one or more embodiments, mask layer 1714 is tri-layer mask stack, e.g., a 193i or EUV resist mask on a ML (e.g., a silicon containing organic layer or a metal containing dielectric layer) on a BARC layer on a silicon oxide hard mask. As shown in FIGS. 26A and 26B, via opening 1704 exposes conductive line 1716. As shown in FIGS. 26A and 26B, conformal liner 302 remains on the sidewalls of via opening 1704, but is removed from the top surface of conductive lines 1716.

FIG. 27 is a view 2700 similar to FIG. 26A, after an upper metallization layer $M_y$ comprising conductive lines extending along Y axis 124 is formed according to one or more embodiment. As shown in FIG. 27, mask layer 1714 and hard mask layer 1504 are removed. In one or more embodiments, each of the mask layer 1714 and hard mask layer 1504 is removed using one or more of the hard mask layer removal techniques know in one of ordinary skill in the art of microelectronic device manufacturing.

An upper metallization layer $M_y$ includes a set of conductive lines 1802 that extend on portions of insulating layer 1102 and portions of insulating layer 960. As shown in FIG. 27, the portions of the insulating layer 1102 are between the portions of the insulating layer 960. Conductive lines 1802 extend along Y axis 124. A fully self-aligned via 1824 includes a trench portion 1804 and a via portion 1806. Via portion 1806 is underneath trench portion 1804. The fully self-aligned via 1824 is between the lower metallization layer comprising recessed conductive lines 202 that extend along X axis 122 and the upper metallization layer comprising conductive lines 1802. As shown in FIG. 27, the via portion 1806 is directly on conductive line 1716 with sidewalls of conformal liner 302. As shown in FIG. 27, the via portion 1806 of the via 1824 is self-aligned along the Y axis 124 to conductive line 1716 that is one of the recessed conductive lines 202. The via portion 1806 of the via 1824 is self-aligned along the X axis (direction) 122 to a conductive line 1822 that is one of the conductive lines 1802. As shown in FIG. 27, the via portion 1806 is a part of the conductive line 1822. As shown in FIG. 27, the size of the via portion 1806 is determined by the size of the cross-section between the conductive line 1716 and conductive line 1822.

In one or more embodiments, forming the conductive lines 1802 and via 1824 involves filling the trenches in the insulating layer and the opening 1702 with a layer of conductive material. In one or more embodiments, a base layer (not shown) is first deposited on the internal sidewalls and bottom of the trenches and the opening 1702, and then the conductive layer is deposited on the base layer. In one or more embodiments, the base layer includes a conductive seed layer (not shown) deposited on a conductive barrier layer (not shown). The seed layer can include copper, and the conductive barrier layer can include aluminum, titanium, tantalum, tantalum nitride, and the like metals. The conductive barrier layer can be used to prevent diffusion of the conductive material from the seed layer, e.g., copper, into the insulating layer. Additionally, the conductive barrier layer can be used to provide adhesion for the seed layer (e.g., copper).

In one or more embodiments, to form the base layer, the conductive barrier layer is deposited onto the sidewalls and bottom of the trenches, and then the seed layer is deposited on the conductive barrier layer. In another embodiment, the conductive base layer includes the seed layer that is directly deposited onto the sidewalls and bottom of the trenches. Each of the conductive barrier layer and seed layer may be deposited using any thin film deposition technique known to one of ordinary skill in the art of semiconductor manufacturing, e.g., sputtering, blanket deposition, and the like. In one or more embodiments, each of the conductive barrier layer and the seed layer has the thickness in an approximate range from about 1 nm to about 100 nm. In one or more embodiments, the barrier layer may be a thin dielectric that has been etched to establish conductivity to the metal layer below. In one or more embodiments, the barrier layer may be omitted altogether and appropriate doping of the copper line may be used to make a "self-forming barrier".

In one or more embodiments, the conductive layer e.g., copper or cobalt, is deposited onto the seed layer of base later of copper, by an electroplating process. In one or more embodiments, the conductive layer is deposited into the trenches using a damascene process known to one of ordinary skill in the art of microelectronic device manufacturing. In one or more embodiments, the conductive layer is deposited onto the seed layer in the trenches and in the opening 1702 using a selective deposition technique, such as but not limited to electroplating, electrolysis, a CVD, PVD, MBE, MOCVD, ALD, spin-on, or other deposition techniques known to one of ordinary skill in the art of microelectronic device manufacturing.

In one or more embodiments, the choice of a material for conductive layer for the conductive lines 1802 and via 1824 determines the choice of a material for the seed layer. For example, if the material for the conductive lines 1802 and via 1824 includes copper, the material for the seed layer also includes copper. In one or more embodiments, the conductive lines 1802 and via 1824 include a metal, for example, copper (Cu), ruthenium (Ru), nickel (Ni), cobalt (Co), chromium (Cr), iron (Fe), manganese (Mn), titanium (Ti), aluminum (Al), hafnium (Hf), tantalum (Ta), tungsten (W), vanadium (V), molybdenum (Mo), palladium (Pd), gold (Au), silver (Ag), platinum (Pt), indium (In), tin (Sn), lead (Pb), antimony (Sb), bismuth (Bi), zinc (Zn), cadmium (Cd), or any combination thereof.

In alternative embodiments, examples of the conductive materials that may be used for the conductive lines 1802 and via 1824 include metals, e.g., copper, tantalum, tungsten, ruthenium, titanium, hafnium, zirconium, aluminum, silver, tin, lead, metal alloys, metal carbides, e.g., hafnium carbide, zirconium carbide, titanium carbide, tantalum carbide, aluminum carbide, other conductive materials, or any combination thereof.

In one or more embodiments, portions of the conductive layer and the base layer are removed to even out top portions of the conductive lines 1802 with top portions of the insulating layer 960 and insulating layer 1102 using a chemical-mechanical polishing ("CMP") technique known to one of ordinary skill in the art of microelectronic device manufacturing.

In one non-limiting example, the thickness of the conductive lines 1802 is in an approximate range from about 15 nm to about 1000 nm. In one non-limiting example, the thickness of the conductive lines 1802 is from about 20 nm to about 200 nm. In one non-limiting example, the width of the conductive lines 1802 is in an approximate range from about 5 nm to about 500 nm. In one non-limiting example, the spacing (pitch) between the conductive lines 1802 is from about 2 nm to about 500 nm. In more specific non-limiting example, the spacing (pitch) between the conductive lines 1802 is from about 5 nm to about 50 nm.

In one or more embodiments, as illustrated in FIG. 27A, the taper angle of the via 1806 is about 90°, and the via 1806 is rectangular in all directions.

In one or more embodiments, the tapering angle of the via 1806 is in a range of from about 60° to about 120°, including about 65°, about 70°, about 75°, about 80°, about 85°, about 90°, about 95°, about 100°, about 105°, about 110°, or about 115°. In one or more embodiments, the tapering angle of the trench 1002 is in a range of from about 80° to about 85°.

With reference to FIG. 27B, the via 1806 is oval shaped and tapered on all four sides. FIG. 27B illustrates the oval shaped top of the via 1806t and the oval shaped bottom of the via 1806b. FIG. 27C shows an embodiment wherein the via 1806 is tapered on two sides. The via 1806 is tapered in the A-A' direction and rectangular in the B-B' direction.

Figure 28:
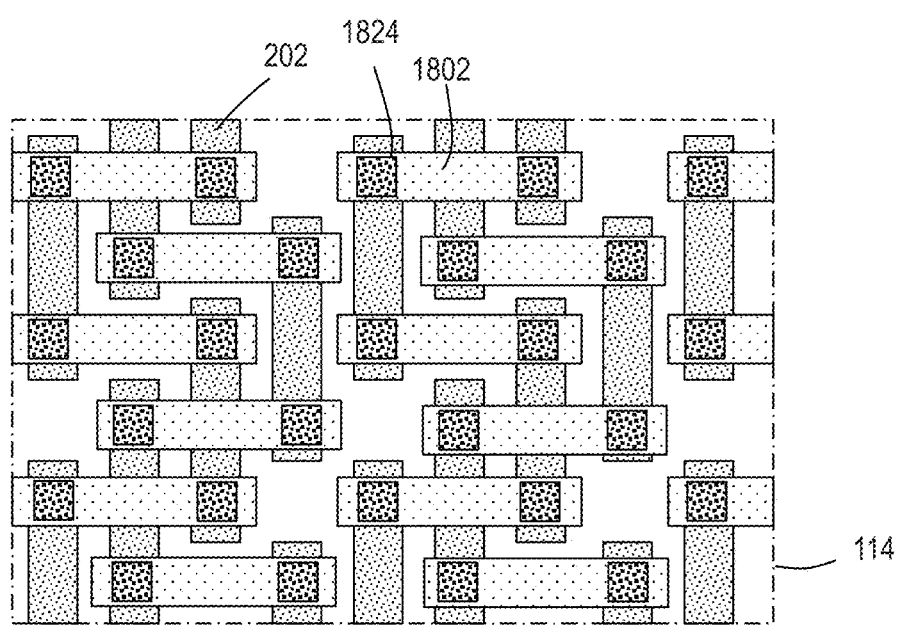
FIG. 28 shows a portion of an electronic device with fully self-aligned vias in accordance with one or more embodiments of the disclosure.

FIG. 28 shows the via 1824 linkages to the first conductive lines 202 and second conductive lines 1802 which cross each other. Cross-over portions that do not have a via 1824 can be maintained by the lithio mask. Combining the self-aligned process with optimized via and routing design rules, the number of masks per layer can be reduced, saving costs and process complexity. FIG. 28 illustrates a portion of an electronic device with the fully self-aligned vias in a nested structure. The first conductive lines 202 extend vertically on the page and the second conductive lines 1802 extend horizontally on the page. Vias 1824 are illustrated where the connections between the first conductive lines 202 and the second conductive lines 1802 occur. The packing and arrangement of the conductive lines and vias can be tighter (i.e., higher density) or looser (i.e., lower density) than the embodiment illustrated.

In the foregoing specification, embodiments of the disclosure have been described with reference to specific exemplary embodiments thereof. It will be evident that various modifications may be made thereto without departing from the broader spirit and scope of the embodiments of the disclosure as set forth in the following claims. The specification and drawings are, accordingly, to be regarded in an illustrative sense rather than a restrictive sense.

What is claimed is:

1. A method to provide a self-aligned via, the method comprising:
   depositing first conductive lines in at least one trench formed in a capping layer and a first insulating layer on a substrate, the first conductive lines extending along a first direction on the first insulating layer;
   recessing the first conductive lines to form recessed first conductive lines, a top surface of the recessed first conductive lines recessed below a top surface of the capping layer on the first insulating layer;
   selectively growing a seed layer on the recessed first conductive lines;
   forming pillars on the seed layer on the recessed first conductive lines;
   depositing a second insulating layer between the pillars;
   removing the pillars to form trenches in the second insulating layer;
   depositing a third insulating layer through the trenches onto the recessed first conductive lines; and
   etching the third insulating layer selectively relative to the second insulating layer to form a via opening down to one of the first conductive lines, wherein the via opening has a tapering angle in a range of from about 60° to about 120°.

2. The method of claim 1, wherein the via opening is self-aligned along the first direction and a second direction to the one of the first conductive lines, the second direction crossing the first direction at an angle.

3. The method of claim 1, further comprising forming a hard mask layer on at least one of the second insulating layer and the third insulating layer.

4. The method of claim 1, further comprising depositing a conformal first liner on the capping layer and the first insulating layer.

5. The method of claim 4, further comprising depositing a conformal second liner on the capping layer and the recessed first conductive lines and depositing a conformal third liner on the conformal second liner.

6. The method of claim 1, further comprising depositing a conductive layer into the via opening.

7. The method of claim 1, wherein the via opening has a trench portion and a via portion underneath the trench portion.

8. The method of claim 1, further comprising: forming second conductive lines on portions of the second insulating layer and the third insulating layer, the second conductive lines extending along a second direction that crosses the first direction at an angle.

9. The method of claim 1, wherein the pillars are removed by etching with a solution of HF and $HNO_3$, a solution of $NH_4OH$ and $H_2O_2$, $WCl_5$, $WF_6$, niobium fluoride, chlorine with a hydrocarbon.

* * * * *